US010098222B2

(12) United States Patent
Frey et al.

(10) Patent No.: US 10,098,222 B2
(45) Date of Patent: Oct. 9, 2018

(54) PATTERNED SUBSTRATES WITH DARKENED MULTILAYERED CONDUCTOR TRACES

(71) Applicant: 3M INNOVATIVE PROPERTIES COMPANY, St. Paul, MN (US)

(72) Inventors: Matthew H. Frey, Cottage Grove, MN (US); Stephen P. Maki, North St. Paul, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 7 days.

(21) Appl. No.: 15/491,430

(22) Filed: Apr. 19, 2017

(65) Prior Publication Data
US 2017/0219741 A1 Aug. 3, 2017

Related U.S. Application Data

(63) Continuation of application No. 15/070,653, filed on Mar. 15, 2016, now Pat. No. 9,661,746, which is a (Continued)

(51) Int. Cl.
*H05K 1/09* (2006.01)
*H05K 1/00* (2006.01)
(Continued)

(52) U.S. Cl.
CPC ........... *H05K 1/0274* (2013.01); *G02B 1/116* (2013.01); *G02B 27/142* (2013.01); *G06F 3/041* (2013.01);
(Continued)

(58) Field of Classification Search
CPC .............................. H05K 1/0274; G02B 1/116
(Continued)

(56) References Cited

U.S. PATENT DOCUMENTS 2,445,962 A 7/1948 Mell
5,179,035 A 1/1993 Shannon
(Continued)

FOREIGN PATENT DOCUMENTS

CN 101887324 11/2010
EP 1781077 5/2007
(Continued)

OTHER PUBLICATIONS

Brown, "The physical and chemical properties of electroless nickel-phosphorus alloys and low reflectance nickel-phosphorus black surfaces", J. Mater. Chem., 2002, vol. 12, No. 9, pp. 2749-2754.
(Continued)

*Primary Examiner* — Sherman Ng
(74) *Attorney, Agent, or Firm* — Clifton F. Richardson; Yen Tong Florczak

(57) ABSTRACT

The present disclosure provides an article having a substrate having opposing first and second surfaces. A conductor micropattern is disposed on the first surface of the substrate. The conductor micropattern has a plurality of traces defining a plurality of cells. The conductor micropattern may have an open area fraction greater than 80% and a uniform distribution of trace orientation. Each of the traces has a trace width from 0.5 to 10 micrometer. The conductor micropattern is a tri-layer material comprising in sequence a semi-reflective metal, a transparent layer, and a reflective layer disposed on the transparent layer. The articles are useful in devices such as displays, in particular, touch screen displays useful for mobile hand held devices, tablets and computers. They also find use in antennas and for EMI shields.

20 Claims, 12 Drawing Sheets

Related U.S. Application Data continuation of application No. 13/979,722, filed as application No. PCT/US2012/023580 on Feb. 1, 2012, now Pat. No. 9,320,136.

(60) Provisional application No. 61/438,800, filed on Feb. 2, 2011.

(51) Int. Cl.

| | | |
|---|---|---|
| *H05K 1/11* | (2006.01) | |
| *G06F 3/041* | (2006.01) | |
| *G06F 3/045* | (2006.01) | |
| *H05K 1/02* | (2006.01) | |
| *H05K 9/00* | (2006.01) | |
| *H05K 3/06* | (2006.01) | |
| *H05K 3/46* | (2006.01) | |
| *G02B 1/116* | (2015.01) | |
| *G02B 27/14* | (2006.01) | |
| *H05K 1/03* | (2006.01) | |
| *B82Y 99/00* | (2011.01) | |
| *B82Y 20/00* | (2011.01) | |
| *B82Y 30/00* | (2011.01) | |
| *H03K 17/96* | (2006.01) | |

(52) U.S. Cl.
CPC ............. *H05K 1/0306* (2013.01); *H05K 1/09* (2013.01); *H05K 3/061* (2013.01); *H05K 3/4644* (2013.01); *H05K 9/0096* (2013.01); *B82Y 20/00* (2013.01); *B82Y 30/00* (2013.01); *B82Y 99/00* (2013.01); *H03K 17/962* (2013.01); *H05K 9/0086* (2013.01); *H05K 2201/0108* (2013.01); *H05K 2201/09681* (2013.01); *Y10S 977/755* (2013.01)

(58) Field of Classification Search
USPC .................. 345/173, 174; 174/257, 258, 261
See application file for complete search history.

(56) References Cited

U.S. PATENT DOCUMENTS

| | | | |
|---|---|---|---|
| 5,236,573 A | 8/1993 | Shannon | |
| 5,694,701 A | 12/1997 | Huelsman | |
| 6,030,708 A | 2/2000 | Ishibashi | |
| 6,297,811 B1 | 10/2001 | Kent | |
| 6,555,235 B1 | 4/2003 | Aufderhelde | |
| 7,032,324 B2 | 4/2006 | Kolb | |
| 7,129,935 B2 | 10/2006 | Mackey | |
| 7,288,946 B2 | 10/2007 | Hargreaves | |
| 7,368,161 B2 | 5/2008 | McGurran | |
| 8,587,552 B2 | 11/2013 | Liang | |
| 2002/0130605 A1 | 9/2002 | Muellner | |
| 2004/0041795 A1* | 3/2004 | Lin | G06F 3/0414 345/173 |
| 2005/0225863 A1* | 10/2005 | Krasnov | H01L 27/3244 359/601 |
| 2006/0267485 A1* | 11/2006 | Wood | H01L 51/5265 313/504 |
| 2007/0229817 A1 | 10/2007 | Wang | |
| 2007/0236618 A1 | 10/2007 | Maag | |
| 2008/0062140 A1 | 3/2008 | Hotelling | |
| 2009/0030084 A1 | 1/2009 | Kurosu | |
| 2009/0135151 A1 | 5/2009 | Sun | |
| 2009/0194344 A1 | 8/2009 | Harley | |
| 2009/0218310 A1 | 9/2009 | Zu | |
| 2009/0219257 A1 | 9/2009 | Frey | |
| 2009/0219258 A1* | 9/2009 | Geaghan | G06F 3/045 345/173 |
| 2009/0316417 A1 | 12/2009 | Chari et al. | |
| 2010/0028564 A1 | 2/2010 | Cheng | |
| 2010/0033818 A1 | 2/2010 | Petcavich | |
| 2010/0040842 A1 | 2/2010 | Everaerts | |
| 2010/0073323 A1 | 3/2010 | Geaghan | |
| 2010/0123670 A1 | 5/2010 | Philipp | |
| 2010/0136265 A1 | 6/2010 | Everaerts | |
| 2010/0156840 A1 | 6/2010 | Frey | |
| 2010/0165469 A1 | 7/2010 | Hwang | |
| 2010/0170710 A1 | 7/2010 | Sasaki | |
| 2010/0182259 A1 | 7/2010 | Jung | |
| 2010/0300729 A1 | 12/2010 | Matsuda | |
| 2010/0300773 A1 | 12/2010 | Cordeiro | |
| 2010/0302201 A1 | 12/2010 | Ritter | |
| 2010/0310875 A1 | 12/2010 | Hao | |
| 2010/0328248 A1 | 12/2010 | Mozdzyn | |
| 2011/0007011 A1 | 1/2011 | Mozdzyn | |
| 2011/0014878 A1 | 1/2011 | Choudhury | |
| 2011/0069029 A1 | 3/2011 | Ryu et al. | |
| 2011/0095997 A1* | 4/2011 | Philipp | G06F 3/044 345/173 |
| 2011/0102361 A1* | 5/2011 | Philipp | G06F 3/044 345/174 |
| 2011/0111182 A1 | 5/2011 | Stay et al. | |
| 2011/0124252 A1 | 5/2011 | Shimomura et al. | |
| 2011/0310489 A1 | 12/2011 | Kajiya | |
| 2012/0105385 A1 | 5/2012 | Sasagawa et al. | |
| 2012/0162232 A1 | 6/2012 | He et al. | |

FOREIGN PATENT DOCUMENTS

| | | |
|---|---|---|
| EP | 2278850 | 1/2011 |
| EP | 2286992 | 2/2011 |
| JP | 2006-339526 | 12/2006 |
| JP | 2006-344163 | 12/2006 |
| JP | 2007-308761 | 11/2007 |
| JP | 2007-335729 | 12/2007 |
| JP | 2008-117955 | 5/2008 |
| JP | 2009-212545 | 9/2009 |
| JP | 2010-108878 | 5/2010 |
| JP | 2010-160927 | 7/2010 |
| JP | 2010-186566 | 8/2010 |
| JP | 2010-205432 | 9/2010 |
| KR | 2010-048931 | 5/2010 |
| KR | 2010-048932 | 5/2010 |
| KR | 2010-0080368 | 7/2010 |
| WO | WO 2003-094253 | 11/2003 |
| WO | WO 2003-105248 | 12/2003 |
| WO | WO 2005-121940 | 12/2005 |
| WO | WO 2008-128073 | 10/2008 |
| WO | WO 2009-108765 | 9/2009 |
| WO | WO 2009-114683 | 9/2009 |
| WO | WO 2009-139458 | 11/2009 |
| WO | WO 2009-142150 | 11/2009 |
| WO | WO 2010-07871 | 1/2010 |
| WO | WO 2010-013679 | 2/2010 |
| WO | WO 2010-019528 | 2/2010 |
| WO | WO 2010-078346 | 7/2010 |
| WO | WO 2010-099132 | 9/2010 |
| WO | WO 2011-002617 | 1/2011 |
| WO | WO 2011-069114 | 6/2011 |
| WO | WO 2007-114196 | 10/2011 |
| WO | WO 2011-139593 | 11/2011 |
| WO | WO 2012-106471 | 8/2012 |
| WO | WO 2013-106241 | 7/2013 |
| WO | WO 2013-116103 | 8/2013 |

OTHER PUBLICATIONS

Cho, "A Black Metal-dielectric Thin Film for High-contrast Displays", Journal of Korean Physical Society, Aug. 2, 2009, vol. 55, No. 2, pp. 501-507.

Cui, "The physical and electrochemical properties of electroless deposited nickel-phosphorus black coatings", Surface & Coatings Technology, Aug. 1, 2006, vol. 200, No. 24, pp. 6808-6814.

Hsiao, "Antireflection coating on metallic substrates for solar energy and display applications", Proceedings of SPIE, Jan. 2011, vol. 7786, pp. 77860N-1-77860N-9.

Krasnov, "High-contrast organic light-emitting diodes on flexible substrates", Applied Physics Letters, May 20, 2002, vol. 80, No. 20, pp. 3853-3855.

(56) References Cited

OTHER PUBLICATIONS

Layani, "Transparent Conductive Coatings by Printing Coffee Ring Arrays Obtained at Room Temperature", ACS Nano, 2009, vol. 3, No. 11, pp. 3537-3542.
Poitras, "Black Layer Coatings for the Photolithographic Manufacture of Diffraction Gratings", Applied Optics, Jun. 2002, vol. 41, No. 16, pp. 3306-3311.
Schönberger, "Large-area fabrication of stochastic nano-structures on polymer webs by ion- and plasma treatment", Surface and Coatings Technology, Jul. 25, 2011, vol. 205, Supplement 2, pp. S495-S497.
Wendling, "Creating Anti-Reflective Nanostructures on Polymers by Initial Layer Deposition before Plasma Etching", Plasma Processes and Polymers, Jun. 2009, vol. 6, No. 1, pp. S716-S-721.
International Search Report for PCT International Application No. PCT/US2012/023480 dated Aug. 7, 2012, 3 pages.

\* cited by examiner

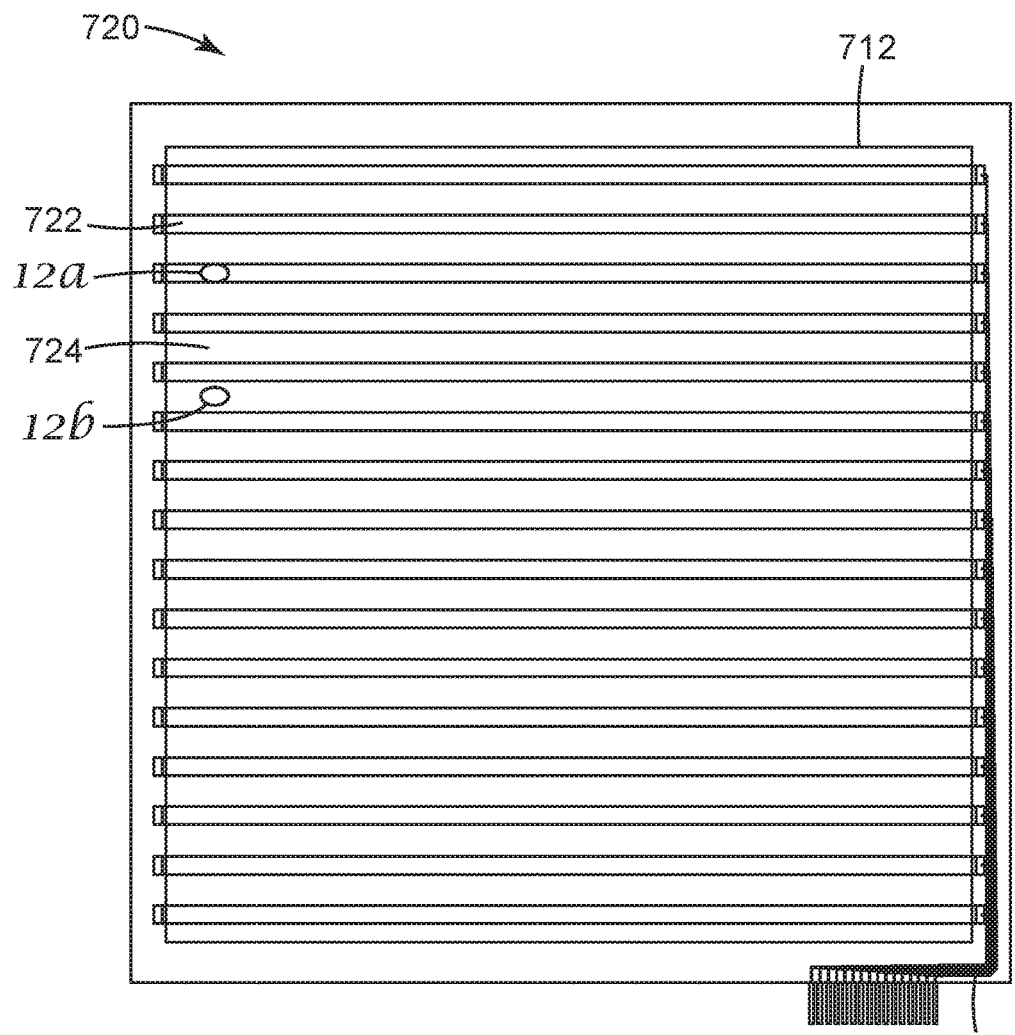
*FIG. 12*
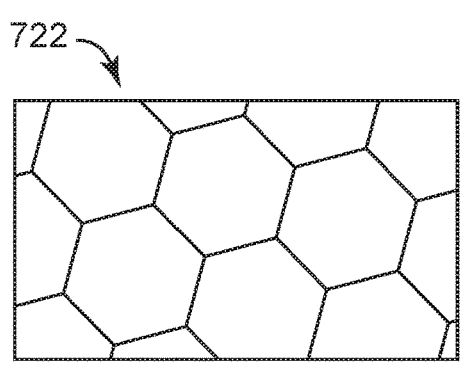 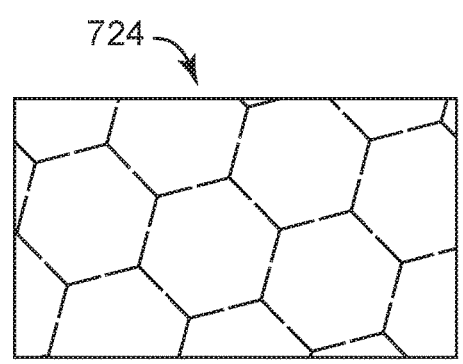
*FIG. 12a*  *FIG. 12b*

PATTERNED SUBSTRATES WITH DARKENED MULTILAYERED CONDUCTOR TRACES

CROSS REFERENCE TO RELATED APPLICATION

This application is a continuation of U.S. application Ser. No. 15/070,653, filed Mar. 15, 2016, which is a continuation of U.S. application Ser. No. 13/979,722, filed Jul. 15, 2013 and issued as U.S. Pat. No. 9,320,136, which is a national stage filing under 35 U.S.C. 371 of PCT/US2012/023480, filed Feb. 1, 2012, which claims the benefit U.S. Provisional Patent Application No. 61/438,800, filed Feb. 2, 2011, the disclosure of which is incorporated by reference herein in its entirety.

BACKGROUND

The use of metal-based conductor mesh for application where light transmission and electrical conductance are needed is known in the art. Examples of such applications include shielding for electromagnetic interference for displays. In the industry, a mesh is typically understood to mean a pattern geometry having connected traces that are separated by open area to form cells.

It has been observed in the current work that some mesh designs, when integrated into a display and viewed under reflected, collimated light (such as in direct sunlight), may produce undesirable visual effects. Illustrative undesirable visual effects include, e.g., a starburst pattern for reflected light and bands of colored reflected light (similar to a rainbow) caused by light interference, each being observable when a mesh containing linear traces and a repeating cell geometry is disposed an unmodified substrate, such as a plastic film or glass. Illustrative examples of meshes with linear traces include those having hexagonal and square cells. Sparkle, which is an undesirable visual appearance of points of reflected light, can also appear for linear traced-based conductor meshes.

Some skilled in the art have attempted to reduce the visual appearance of overlaid mesh micropatterns by using wavy traces in producing a display, such as a touch screen display. See, e.g., PCT International Publication No. WO 2010/099132 A2 describing a articles such as antennas, electromagnetic interference shields and touch screen sensors having a light transparent substrate and two conductive meshes, each having linear traces, where the first mesh overlays a second mesh in a certain configuration so as to minimize the traces' visibility.

Others have attempted to use ambient light reducing members such as an optical interference member. See PCT International Publication No. WO 2003/105248 disclosing an optical interference member including a semi-absorbing member layer for reflecting a portion of incident ambient light, a substantially transparent layer for phase shifting another portion of ambient light and a reflective layer for reflecting the phase shifted ambient light such that the two reflected portions of light are out-of-phase and thereby destructively interfere.

SUMMARY

There is a desire to improve the visual appearance of the metal-based conductor meshes, in terms of reducing their visibility, when the mesh is integrated into a display and viewed under reflected, collimated light, such as in direct sunlight.

The present disclosure provides articles using modified substrates or conductive optical interference layer in combination with designs of conductor micropatterns. When integrated into a display or device, the combination reduces the undesirable visual effects, such as starburst, sparkle, halo and rainbow, when the display or device is viewed under light, including but not limited to collimated or nearly collimated light, such as sunlight.

In one aspect, the present disclosure pertains to an article comprising (a) a substrate having opposing first and second surfaces; and (b) a conductor micropattern disposed on the first surface of the substrate, the conductor micropattern comprising a plurality of traces defining a plurality of cells, wherein the conductor micropattern has an open area fraction greater than 80% and a uniform distribution of trace orientation; and each of the traces has a trace width from 0.5 to 10 micrometer, and wherein the conductor micropattern comprises a tri-layer material comprising, in sequence, a semi-reflective metal, a transparent layer, and a reflective layer disposed on the transparent layer.

BRIEF DESCRIPTION OF THE DRAWINGS

The disclosure can be further described with reference to the following drawings, wherein:

FIGS. 12, 12a and 12b show various portions of a second micropatterned substrate useful for integration into a device, such as a display;

Figure 1:
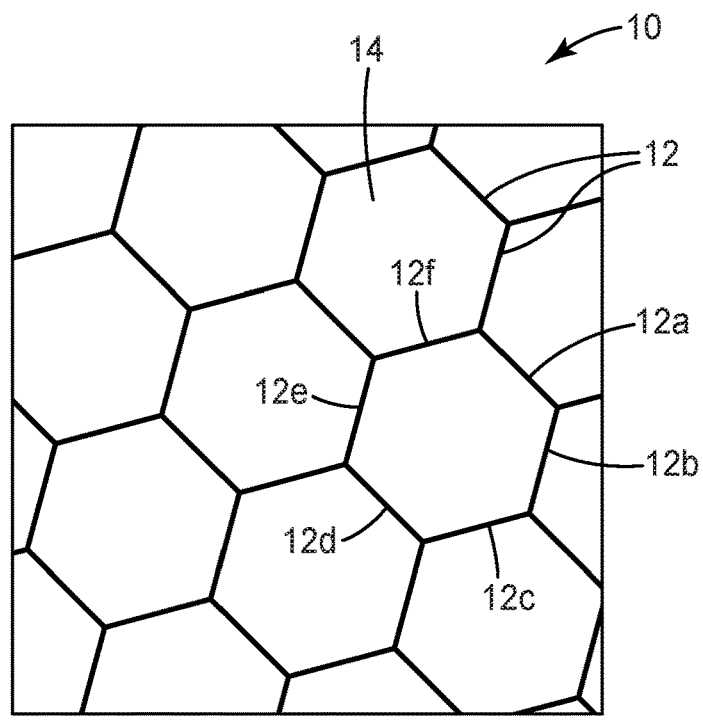
FIG. 1 is a top plan view of a schematic of a regular hexagonal micropattern.

These figures are not drawn to scale and are intended for illustrative purposes

DETAILED DESCRIPTION

Unless otherwise indicated, all numbers expressing feature sizes, amounts and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art using the teachings disclosed herein.

The recitation of numerical ranges by endpoints includes all numbers within that range (e.g., 1 to 5 includes, 1, 1.5, 2, 2.75, 3, 3.80, 4 and 5) and any range within that range.

As used herein "micropattern" refers to an arrangement of dots, traces, filled shapes, or a combination thereof, each having a dimension (e.g. trace width) of no greater than 1 mm. In preferred embodiments, the micropattern is a mesh formed by a plurality of traces defining a plurality of cells, each trace having a width of at least 0.5 microns and typically no greater than 20 microns. The dimension of the micropattern features can vary depending on the micropattern selection. In some favored embodiments, the micropattern feature dimension (e.g. trace width) is less than 10, 9, 8, 7, 6, or 5 micrometers (e.g. 1 to 3 micrometers). Linear and non-linear traces are useful in the present disclosure.

As used herein, "visible light transparent" refers to the level of transmission of the unpatterned substrate or of the article comprising the micropatterned substrate being at least 60 percent transmissive to at least one polarization state of visible light, where the percent transmission is normalized to the intensity of the incident, optionally polarized light. It is within the meaning of visible light transparent for an article that transmits at least 60 percent of incident light to include microscopic features (e.g., dots, squares, or traces with minimum dimension, e.g. width, between 0.5 and 10 micrometers, between 0.5 and 5 micrometers, or between 1 and 5 micrometers) that block light locally to less than 60 percent transmission (e.g., 0 percent); however, in such cases, for an approximately equiaxed area including the microscopic feature and measuring 1000 times the minimum dimension of the microscopic feature in width, the average transmittance is greater than 60 percent. The term "visible" in connection with "visible light transparent" is modifying the term "light," so as to specify the wavelength range of light for which the substrate or micropatterned article is transparent.

As used herein, "open area fraction" (or open area or percentage of open area) of a conductor micropattern, or region of a conductor micropattern, is the proportion of the micropattern area or region area that is not shadowed by the conductor. The open area is equal to one minus the area fraction that is shadowed by the conductor micropattern, and may be expressed conveniently, and interchangeably, as a decimal or a percentage. Area fraction that is shadowed by conductor micropattern is used interchangeably with the density of lines for a conductor micropattern. Illustrative open area fraction values useful in the present disclosure are those greater than 50%, greater than 75%, greater than 80%, greater than 90%, greater than 95%, greater than 96%, greater than 97%, greater than 98%, greater than 99%, 99.25 to 99.75%, 99.8%, 99.85%, 99.9% and even 99.95. In some embodiments, the open area of a region of the conductor micropattern (e.g., a visible light transparent conductive region) is between 80% and 99.5%, in other embodiments between 90% and 99.5%, in other embodiments between 95% and 99%, in other embodiments between 96% and 99.5%, in other embodiments between 97% and 98%, and in other embodiments up to 99.95%.

As used herein, "trace" refers to the geometric element given by the intersection of two planes or by the intersection of a plane and a non-planar surface. The geometric element given by the intersection of two planes is described herein as linear (or, as a linear trace). The geometric element given by the intersection of a plane and a non-planar surface is described herein as non-linear (or, as a non-linear trace). A linear trace has zero curvature, or stated differently it has infinite radius of curvature. A non-linear trace has non-zero curvature, or stated differently it has a finite radius of curvature. Curvature or radius of curvature can be determined for any point along a trace, as is known in analytic geometry. Also, a normal can be constructed at a point that lies on a linear or non-linear trace, as is also known in analytic geometry.

As used herein, "antireflective" refers to the behavior of a surface or coating that reduces Fresnel light reflection at the interface between a material and a surrounding medium to which the material is exposed, and enhances light transmission through the interface. In the absence of an antireflective surface or coating, Fresnel reflection is governed by the difference between refractive indices of the material and the surrounding medium, as is known in the art.

Micropattern Designs

A number of different geometries or designs can be used for conductor micropatterns useful for present disclosure. The classes of mesh micropattern design include: (A) those with repeating cell geometry, (B) those with non-repeating cell geometry, (C) those with cells having centroids that do not lie on a repeating array, (D) those that have cells where the traces have a uniform distribution of trace orientation. These classes are not mutually exclusive. Within each of these classes, the traces can be linear or non-linear (i.e., having some finite radius of curvature). The mesh micropatterns described below are not limited with respect to the width of traces or the sizes of cells. In some embodiments, the traces have a width in the range of 0.1 to 20 micrometers, in some embodiments in the range of 0.5 to 10 micrometers, in some embodiments in the range of 0.5 to 5 micrometers, in some embodiments in the range of 0.5 to 4 micrometers, in some embodiments in the range of 0.5 to 3 micrometers, in some embodiments in the range of 0.5 to 2 micrometers, in some embodiments from 1 to 3 micrometers, in some embodiments in the range of 0.1 to 0.5 micrometers. In some embodiments, the open area of a region of the mesh conductor micropattern (e.g., a visible light transparent conductive region) is between 80% and 99.5%, in other embodiments between 90% and 99.5%, in other embodiments between 95% and 99%, in other embodiments between 96% and 99.5%, in other embodiments between 97% and 98%, and in other embodiments up to 99.95%.

(A) Micropatterns with Repeating Cells

A characteristic of repeating cell geometries is that the cells lie on a repeating array. For cells to lie on a repeating array, what meant is that the centroids of the cells lie no greater than a short distance away from positions that define the array (under the limit that there be only one array position per cell). This description of the positional relationship of cells focuses on the open areas (or openings) of the mesh cells, not on the traces or the trace junctions (vertices) of the mesh. In some instances where cells lie on a repeating array, the centroids of the cells lie precisely on the array of points (i.e., positions). By arrays, what is meant is an arrangement of positions in two-dimensions (i.e., in the plane of the micropattern) characterized by discrete translational symmetry for a unit cell comprising no more than positions. The translational symmetry of the array is defined in terms of one or more basis vectors that define the minimum translation within the plane of the micropattern over which the array is invariant. In this context, arrays can include square arrays (or square lattices), rectangular arrays (or rectangular lattices), or triangular arrays (or triangular lattices), for example. By a short distance, as this term relates to the allowance for centroids of a mesh comprising cells that are described herein to lie on a repeating array to be displaced from the precise positions of the array, what is meant is a distance less than 50% of the value given by taking the length of the shortest array basis vector that can be constructed in the orientation of the displacement and dividing that length by the number of array positions in the unit cell that is associated with that basis vector. In some embodiments where the cells lie on a repeating array, the distance by which the centroids are displaced from the positions of the array is less than 25% of the value given by taking the length of the shortest array basis vector that can be constructed in the orientation of the displacement and dividing that length by the number of array positions in the unit cell that is associated with that basis vector. Illustrative examples of these types of micropatterns are shown in FIGS. 1, 3, 4 and 14.

Turning now to the figures, FIG. 1 shows a top plan view of an illustrative geometry of a regular hexagonal conductor micropattern 10 that is formed by a plurality of linear traces 12. Six traces, 12a through 12f, form a cell 14 having an open area. As shown, each trace is of substantially equal length and each of the six internal angles is of substantially 120°. The centroids of the mesh cells lie on a triangular lattice (or array). The distance from the centerline of a trace defining one edge of the hexagonal cell to the centerline of the (parallel) trace defining the opposite edge of the hexagonal cell is, for example, 200 micrometers.

Figure 3:
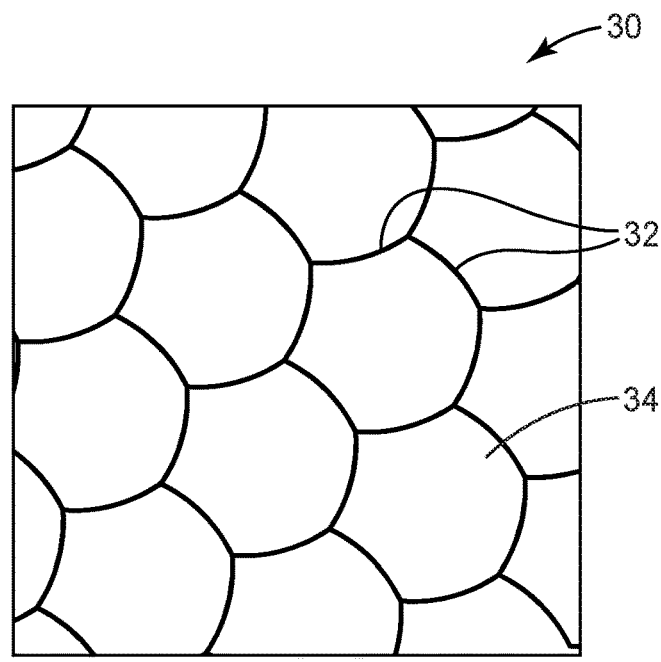
FIG. 3 is a top plan view of a schematic of a first illustrative non-linear micropattern design, based on a regular hexagon, and referred to herein as a partially curved hexagon micropattern.
Figure 3A:
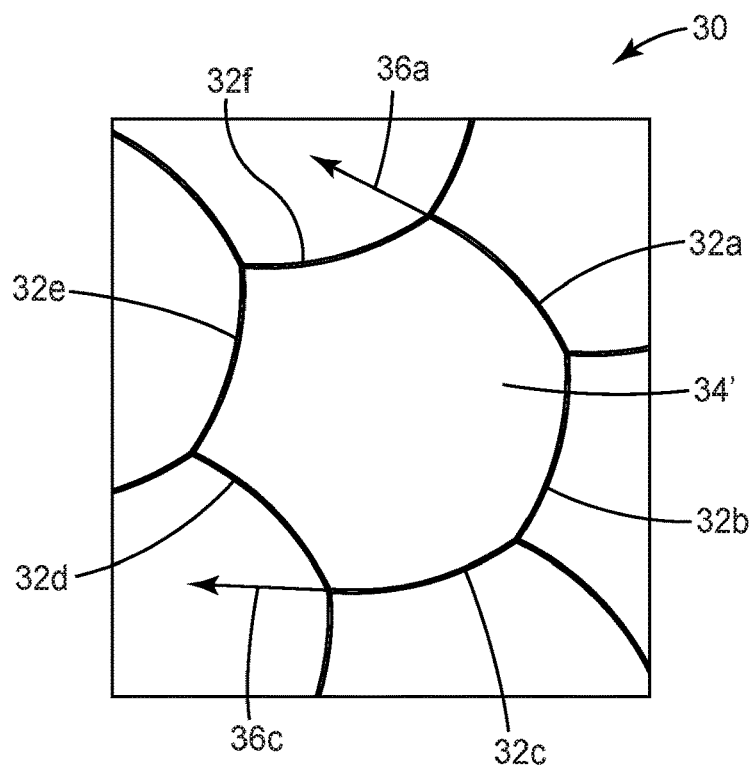
FIG. 3a is an exploded view of a few cells of the micropattern of FIG. 3.

FIG. 3 shows a top plan view of an illustrative geometry of a non-linear design, i.e., a partially curved hexagonal conductor micropattern 30 formed by a plurality of curved traces 32 defining a plurality of open area cells 34. In one method, this micropattern design can be generated starting from the regular hexagonal micropattern design shown in FIG. 1 and displacing the midpoint of each trace by some distance, e.g., by 10 micrometers, and allowing the trace to bow. FIG. 3a shows a magnified cell 34' with six traces, 32a through 32f shown. One characteristic of the micropattern 30 is that tangents 36a and 36c for traces 32a and 32c respectively are generally not parallel to one another. Similarly to the mesh micropattern of FIG. 1, the centroids of the mesh cells of FIG. 3 lie on a triangular lattice of points (i.e., array of points).

Figure 4:
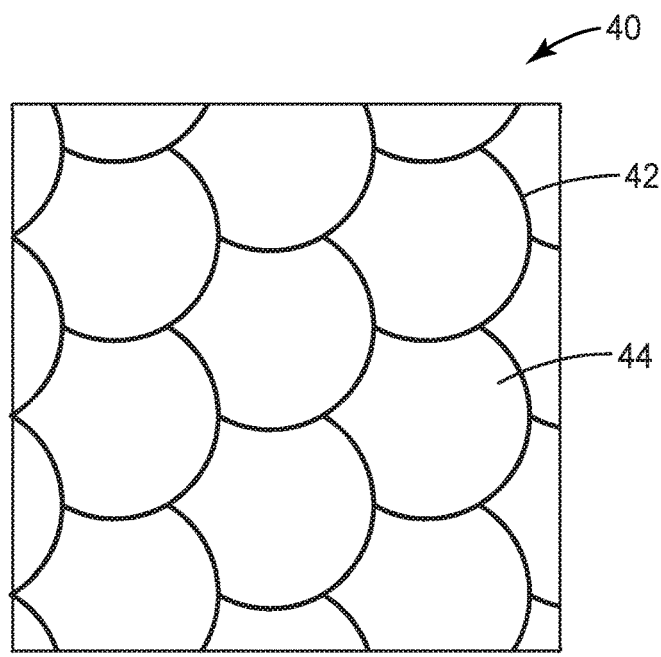
FIG. 4 is a top plan view of a schematic of a second illustrative non-linear micropattern design, based on a regular hexagon, and referred to herein as a fully curved hexagon micropattern.
Figure 4A:
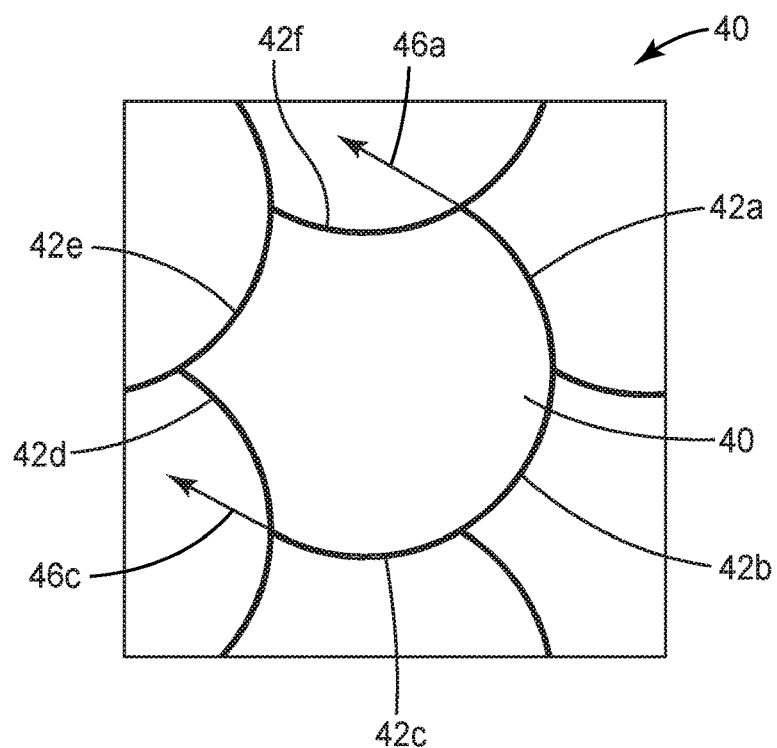
FIG. 4a is an exploded view of a few cells of the micropattern of FIG. 4.

FIG. 4 shows a top plan view of an illustrative geometry of another non-linear design, a fully curved hexagonal conductor micropattern 40 formed by a plurality of curved traces 42 defining a plurality of cells 44. In one method, this micropattern design can be generated by decreasing the radius of curvature of the traces shown in FIG. 3 by, e.g., further displacing the midpoints of each trace. FIG. 4a shows a magnified cell 44' with six traces, 42a through 42f.

One characteristic of the micropattern 40 is that tangents 46a and 46c for traces 42a and 42c respectively are generally parallel to one another. Similarly to the mesh micropattern of FIG. 1, the centroids of the mesh cells of FIG. 4 lie on a triangular lattice of points (i.e., array of points).

Figure 14:
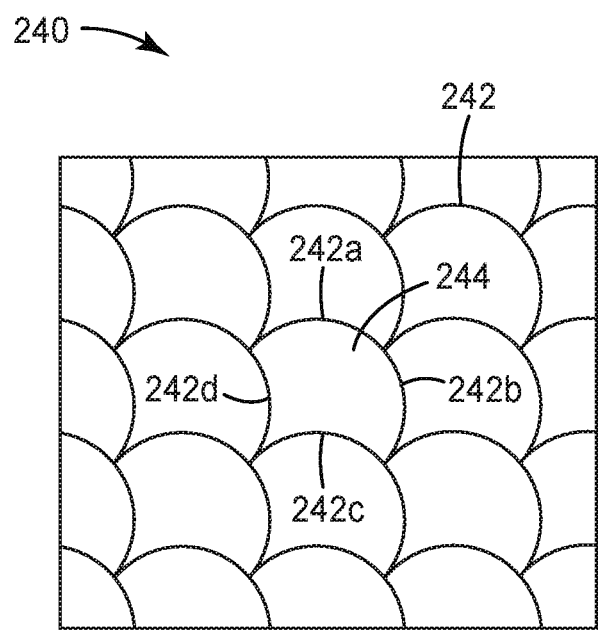
FIG. 14 is a top plan view of a third illustrative non-linear micropattern, referred to herein as a fully curved square micropattern.

FIG. 14 shows another exemplary non-linear micropattern design 240 that can be generated starting from a square and displacing the midpoint of each side of the square by some distance, and allowing the trace to bow. Four traces, 242a to 242d are shown defining open area cells 244. The centroids of the mesh cells of FIG. 14 lie on a square lattice (i.e., array of points).

(B) Micropatterns with Non-Repeating Cells

For mesh micropatterns having non-repeating cell geometry, the cells may lie on a repeating array (e.g., a rectangular array, a square array, or a triangular array) or they may not. In this cell geometry, the cells are not of the same size and the same shape. An illustrative example of this type of cell geometry is shown in FIG. 2.

Figure 2:
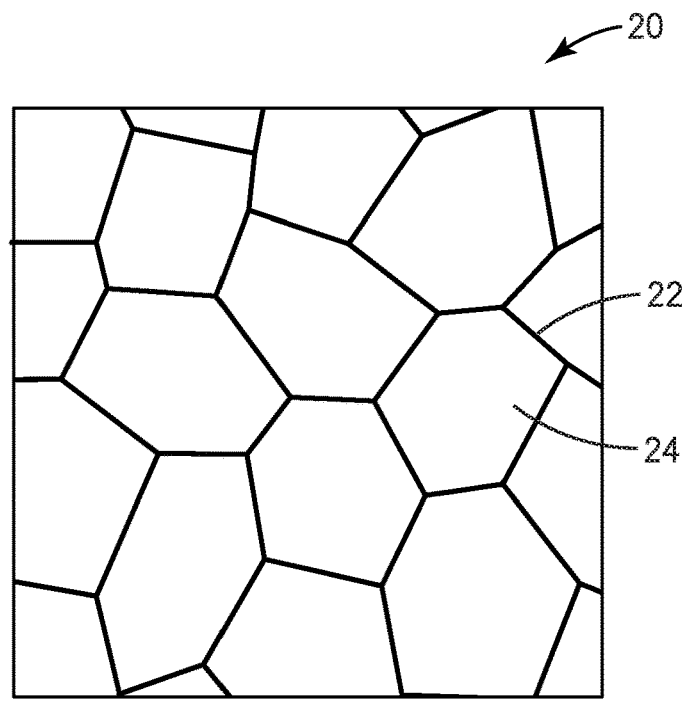
FIG. 2 is a top plan view of a schematic of a portion of a polygonal micropattern, referred to herein as a pseudorandom hexagonal micropattern.

FIG. 2 shows a top plan view of an illustrative geometry of a pseudorandom hexagonal conductor micropattern 20 formed by plurality of linear traces 22 defining a plurality of cells 24. In one method, this micropattern design can be generated by starting from the regular hexagonal pattern design shown in FIG. 1 and displacing the vertices in a randomized direction and by a randomized distance less than the edge length of the original hexagonal cell, and maintaining linear traces. One characteristic of the micropattern 20, when generated by displacing vertices by a distance less than the edge length of the original hexagonal cell (e.g., by a distance less than half of the edge length), is that the centroids of the cells lie within a short distance from the points of an array defined by the original centroid locations of the cells of the mesh of FIG. 1. More specifically the centroids of the cells of the mesh of FIG. 2 lie within a distance equal to 50% of the minimum separation between array positions defined by the centroids of the original mesh of FIG. 1 (i.e., 50% of the length of a basis vector in the direction of the displacement, for triangular lattice defined by the hexagonal mesh cell centroids). This result is due to the fact that the centroid of each original mesh cell opening of FIG. 1 has not been displaced substantially by the procedure of slightly moving the vertices. In this case, the cells are referred to herein as lying on an array. In some embodiments disclosed later herein, the locations of centroids (not just the locations of vertices) are also specified to be randomized.

(C) Micropatterns with Cells not on an Array

As defined above, if the cells of a mesh micropattern are arranged in two dimensions in such a way that the centroids of the cells lie no greater than a short distance from positions that define an array, then the mesh cells are regarded herein to lie on a repeating array (or on an array). In some instances where cells lie on a repeating array, the centroids of the cells lie precisely on the array of points. A characteristic of a micropattern having cells not on a repeating array (i.e., not lying on a repeating array), as the term is used herein, is that the centroids of the mesh cells (i.e., centroids of the cell openings) are arranged in such a way that no array of positions can be constructed using a unit cell comprising four or fewer positions, such that all of the centroids of the mesh lie within a distance less than 50% of the value given by taking the length of the shortest array basis vector that can be constructed in the orientation of the displacement and dividing by the number of array positions in the unit cell that is associated with that basis vector (under the additional limitation that there be only one array position per mesh cell). For this mesh micropattern, the cells are generally not of the same size and shape. Of the three micropatterns discussed thus far (A, B, and C), the C-type micropattern has a higher degree of disorder. An illustrative example of this type of cell geometry is shown in FIG. 5.

Figure 5:
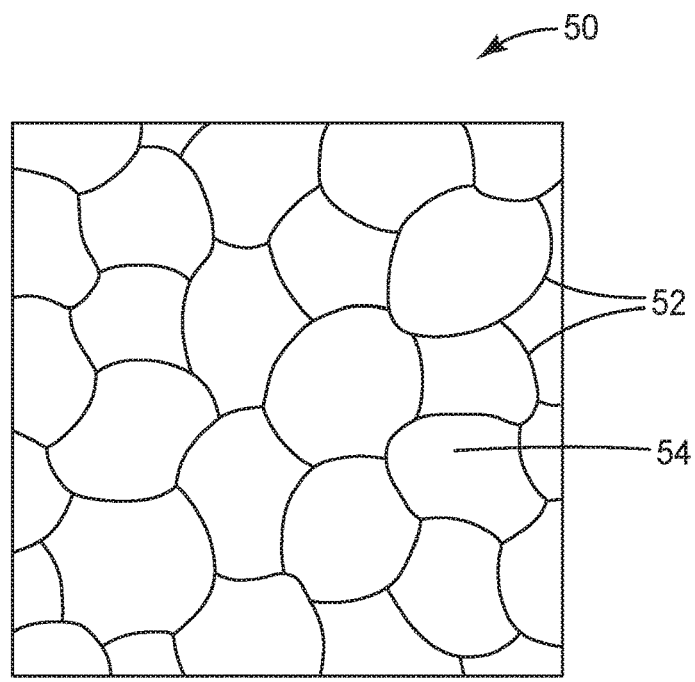
FIG. 5 is a top plan view of a third illustrative non-linear micropattern, a pseudorandom curved design.

FIG. 5 shows a top plan view of a portion of yet another non-linear design, a pseudorandom curved conductor micropattern 50 formed by a plurality of traces 52 defining a plurality of open area cells 54. This geometry includes cells defined by curved conductive traces, each having an exemplary width of 2 micrometers. The cells of a conductor micropattern with the pseudorandom curved design may have a varying number of edges or traces that define the cells, e.g., from four to eight edges. The sizes of the cells vary from an area of 10,000 square micrometers to an area of 70,000 square micrometers. For reference, the area of the regular hexagonal micropattern of FIG. 1 is 35,000 square micrometers. The positions of the cells, e.g., as defined by the centroid of each cell, do not lie on a regularly spaced array.

D. Micropatterns with Uniform Distribution of Trace Orientation

A characteristic of this type of micropattern is that it is not limited in terms of a cell geometry or in terms of the position of the centroids of cells. To better describe this type of micropattern geometry, the concept of angular distribution of trace orientation is used.

Angular Distribution of Trace Orientations

Each trace design can be characterized by an angular distribution of trace orientations, as further described herein. The angular distribution of trace orientations for the pseuodorandom curved designs herein, as measureable according to a procedure described herein and over an area of 1 centimeter by 1 centimeter, is substantially uniform. For example, in some embodiments, with respect to the uniformity of the distribution, no reference orientation can be established within the plane of the micropattern for which there are no normals to trace segments in the micropattern that exist within plus or minus 10 degrees of that reference orientation. In some cases, no reference orientation can be established within the plane of the micropattern for which there are no normals to trace segments in the micropattern that exist within plus or minus 5 degrees of that reference orientation. In some cases, no reference orientation can be established within the plane of the micropattern for which there are no normals to trace segments in the micropattern that exist within plus or minus 2 degrees of that reference orientation. Further with respect to the uniformity of the distribution, over, e.g., 1 centimeter by 1 centimeter area, there are no two 20° ranges of orientation in the plane of the micropattern for which the integrated density of the normals to the trace segments in the two ranges is different by more than 50% of the smaller of the two integrated density values. In some cases, over, e.g., 1 centimeter by 1 centimeter area, there are no two 20° ranges of orientation in the plane of the micropattern for which the integrated density of the normals to the trace segments in the two ranges is different by more than 25% of the smaller of the two integrated density values. In some cases, over, e.g., 1 centimeter by 1 centimeter area, there are no two 20° ranges of orientation in the plane of the micropattern for which the integrated density of the normals to the trace segments in the two ranges is different by more than 10% of the smaller of the two integrated density values. In some cases, over, e.g., 1 centimeter by 1 centimeter area, there are no two 10° ranges of orientation in the plane of the micropattern for which the integrated density of the normals to the trace segments in the two ranges is different by more than 10% of the smaller of the two integrated density values. In some cases, over, e.g., 1 centimeter by 1 centimeter area, there are no 5° ranges of orientation in the plane of the micropattern for which the integrated density of the normals to the trace segments in the two ranges is different by more than 10% of the smaller of the two integrated density values.

The micropatterns of the present disclosure provide for the simultaneous minimization of a large number of potentially undesirable visual features with have been observed for other micropatterns, especially when combined with an information display (e.g., on a mobile phone, smart phone, tablet computer, laptop computer, desktop computer monitor, reading device, automotive display, or retail display). These potentially undesirable visual features include starburst, rainbow, and sparkle, as already described. The potentially undesirable features that are mitigated by the micropattern designs also include moiré interference with the pixel pattern of the display. The potentially undesirable features that are mitigated by the micropattern designs also include substantial blockage (e.g., 25%, 50%, or even 75%) of the viewability of individual pixels of the display (obscuring the information, but not necessarily leading to a moiré pattern). It is within the scope of this disclosure for the micropattern to be tilted (e.g., rotated or biased) with respect to a display, in order to optimize the mitigation of one or more of the potentially undesirable visual features. Tilting of the micropattern can be especially useful for minimizing moiré interference with a pixilated display. In some cases, a four-sided cell geometry, distributed on a square array of positions (e.g., fully curved square cell geometry) is convenient for minimization of moiré interference though tilting.

The orientations of the population of traces useful in the present disclosure can be quantified as a distribution that describes the relative concentration, presence, or abundance of trace segments of different orientations within the micropattern. This distribution can be used to describe the orientations of the population of traces in micropatterns that comprise linear traces or non-linear traces. Also, it can be used to describe the orientations of the population of traces in micropatterns that comprise repeating geometries (e.g., as in the case of a square or hexagonal micropattern) or in micropatterns that comprise non-repeating geometries (e.g., as in the case of pseudorandom micropattern designs comprising linear (as in FIG. 2) or non-linear (as in FIG. 5) traces. The descriptor is the integrated micropattern trace length per unit area of micropattern, as a function of the orientation of a normal to the trace. Stated in another way, the descriptor can be expressed as the frequency distribution of orientations for trace segments (or the distribution of orientations of normals to the trace segments) that form a conductor micropattern. By "integrated," what is meant is the summation of total trace width for traces within a defined area that have the specified orientation.

In order to collect the above described frequency characteristics for orientations within conductor micropatterns having non-linear traces, the following procedure can be used. The procedure includes a series of manual drawing and measurement steps for a magnified print of the micropattern design on, for example, 11 inch by 17 inch paper. The characterization procedure include the steps of (a) printing a magnified rendering of the micropattern on paper, (b) partitioning the traces of the micropattern into at least 200 segments of approximately equal path length, (c) manually drawing a normal to each segment, (d) establishing an orientation frame of reference by establishing a 0° direction, and then (e) measuring the orientation of every normal with respect to the 0° direction (e.g., using a protractor). The traces, and thus the normals to the traces, can be specified using 180° of angular range for the following reason. A trace that runs straight up and down can be arbitrarily described to be oriented up or down. A trace or its normal that is oriented upward is no different from a trace or its normal that is oriented downward. Thus, one cannot generate a trace that is oriented upward in any way different from a trace that is oriented downward (i.e., there is no meaning to a suggestion that the upward trace is different from the downward trace). Thus, the full range of possible trace segment orientations requires only 180° of angular range.

Figure 6:
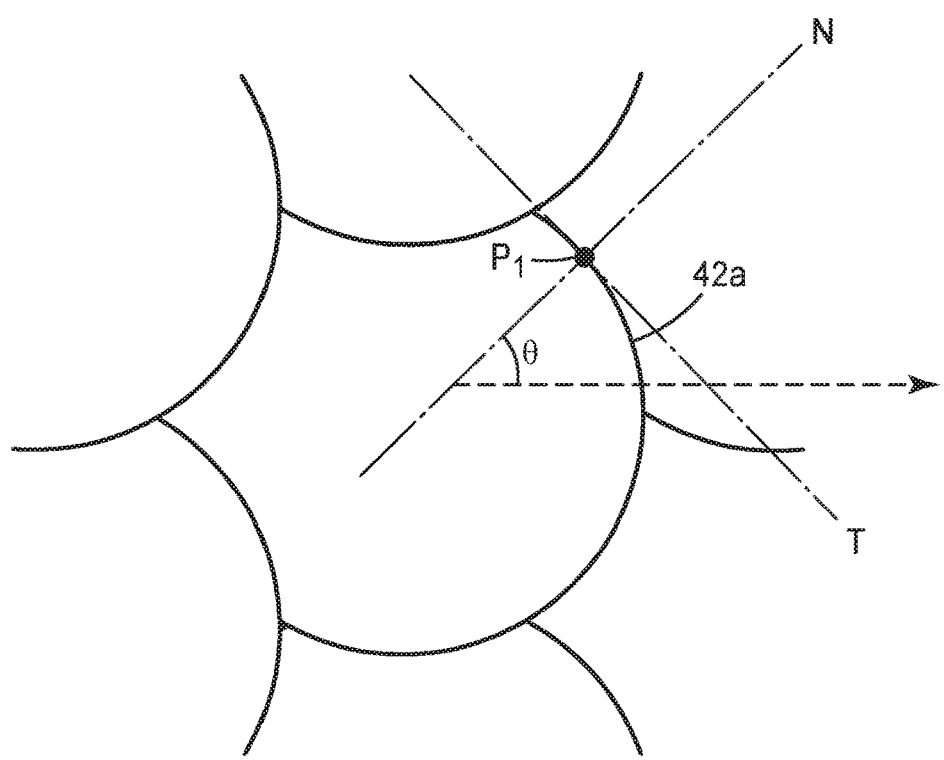
FIG. 6 shows a cell in a micropattern illustrating a measurement method to determine an orientation to a trace.

FIG. 6 shows a diagram of one full cell of the embodiment of FIG. 4 where angle of a normal to a trace orientation is being measured at trace segment $P_1$. For purposes of simplicity, only one of the 200 segments is shown. A normal line N to the trace segment $P_1$ is drawn as shown in the figure. A tangent line T is drawn intersecting both trace segment $P_1$ and normal line N. A reference zero degree line is drawn as shown by a dashed arrow. An angle theta (θ) can then be measured to determine the angle between the reference line and the normal line. This measurement is then repeated multiple times for segments similar to $P_1$ along each of the six traces. An arbitrary, but sufficiently large number of segments (in this case, 200 segments for statistically significant measurement) can be drawn for the cell. An approximately equal number of segments is drawn for each of the six traces.

The so-measured distribution of the orientation of the normal to a trace segment can be rendered by plotting a histogram of the orientation measurements. It should be noted that the distribution of the orientation of the normal to a trace segment provides a direct correlation to the distribution of the orientation of the trace segment itself. For micropatterns herein, the procedure was carried out for the traces making up at least one complete cell of the micropattern. For micropatterns having a single cell shape and size, replicated in two directions in order to yield a two-dimensional micropattern, characterization of the traces that make up a single cell is adequate to determine the distribution of trace orientations for the two dimensional micropattern over larger areas (for example over areas covering 10, 100, or even 1000 cells). For example, characterization of the traces that make up a single regular hexagonal cell measuring 200 micrometers in diameter is adequate to determine the distribution of trace orientations for a regular hexagonal micropattern of such cells measuring 1 millimeter by 1 millimeter, 1 centimeter by 1 centimeter, or even 1 meter by 1 meter. For micropatterns having multiple cell shapes or sizes, a sufficient number of cells should be characterized in order to determine the distribution of trace orientations for the overall micropattern with useful accuracy (e.g., where the so-measured distribution of trace orientations exhibits an $R^2$ correlation coefficient of at least 0.8, at least 0.9, at least 0.95, or even at least 0.99 when compared with the actual distribution of trace orientations over an area of the actual conductor micropattern of 1 millimeter by 1 millimeter, 1 centimeter by 1 centimeter, or even 1 meter by 1 meter).

Once the orientations of normals (represented by the angle θ) to the trace segments are measured, they can be binned into two micron bins thereby generating 90 bins from 0 to 180 degrees. Each bin includes an integer representing the number of measurements that yielded an orientation within the bin's two degree angular range. This binning procedure produces a discrete distribution of orientations. Finally, the standard deviation of the frequency values (standard deviation of measured frequency per 2 degree bin) can be calculated. For some distributions of the normal to the trace segment, and thus the distribution of trace orientation described herein to be considered uniform, the so calculated standard deviation is less than four. For some distributions of trace orientations described herein as uniform, the so calculated standard deviation is less than three. For some distributions of trace orientations described herein as uniform, the so calculated standard deviation is less than two. For some distributions of trace orientations therein uniform, the so calculated standard deviation is less than one.

Figure 7:
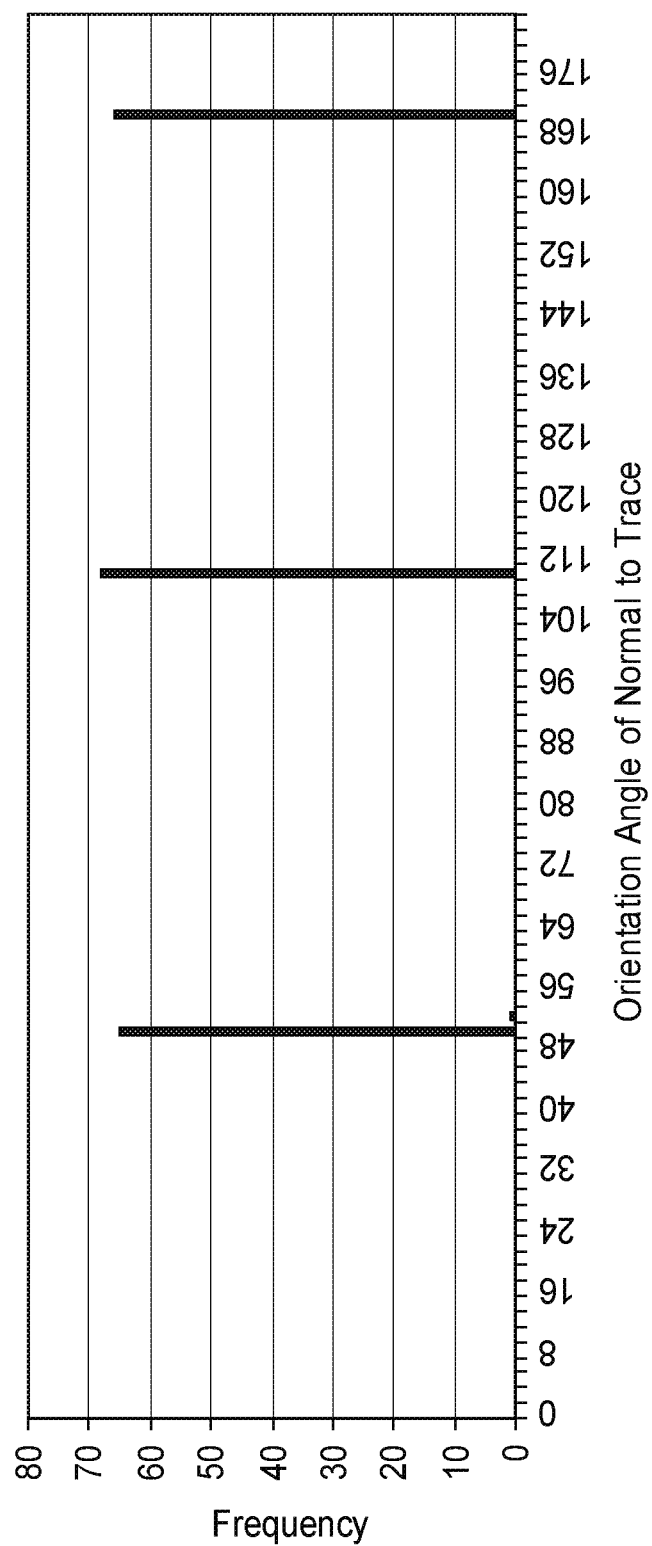
FIG. 7 shows a histogram of the orientation of normal to the trace segments for the micropattern of FIG. 1.

FIG. 7 shows a histogram of the angle θ for the multiple trace segments of the micropattern of FIG. 1, regular hexagon. Three distinct peaks result at three angles, each angle being about 60 degree apart from the other peak. It should be noted that the absolute value of the angle shown on the x-axis of the histogram is arbitrary in that the three peaks can occur at other angles, such as 40°, 100° and 160°, so long as they are about 60° apart. The three peaks result because, with reference to FIG. 1, the orientation angle for the normals would be the same for traces 12a as 12d, 12b as 12e and 12c as 12f. For this micropattern, the standard deviation of measured frequency per 2 degree bin was measured as 11.6, a direct indication of the highly non-uniform.

Figure 8:
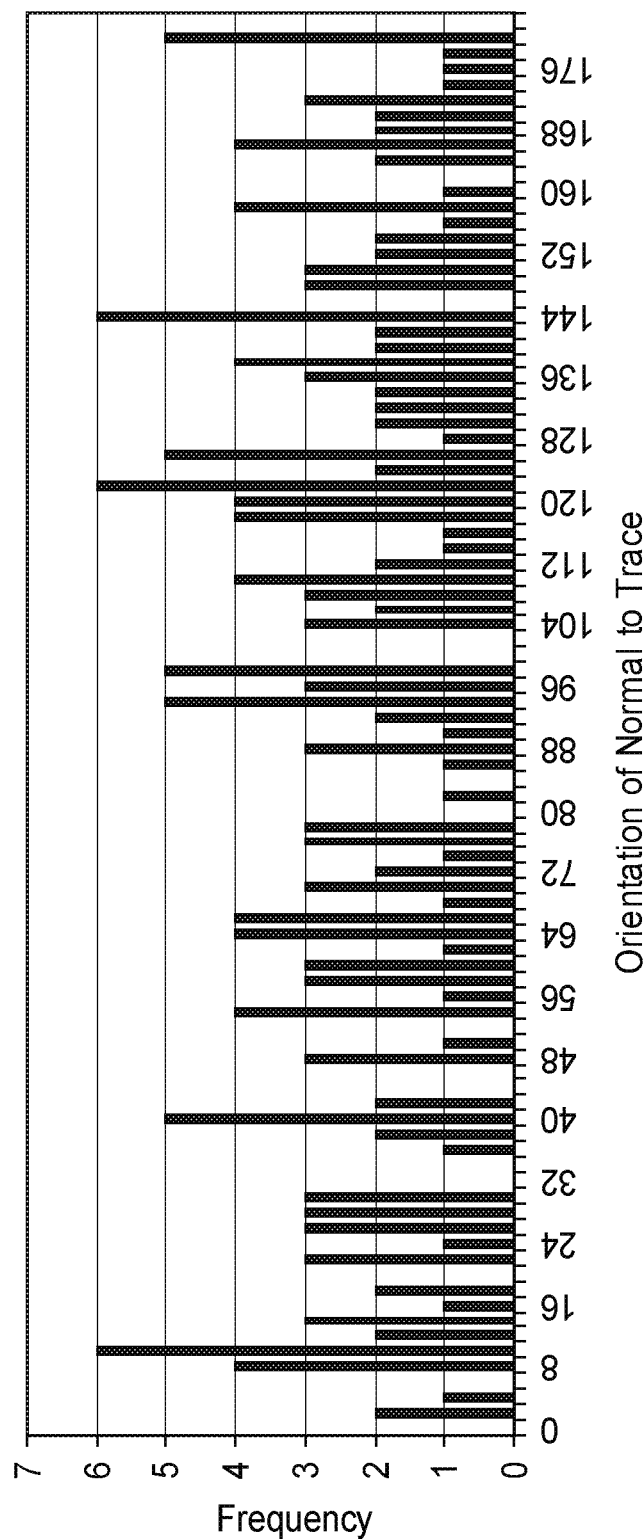
FIG. 8 shows a histogram of the orientation of normal to the trace segments for the pseudorandom hexagonal micropattern, a portion of which is illustrated in FIG. 2.
Figure 9:
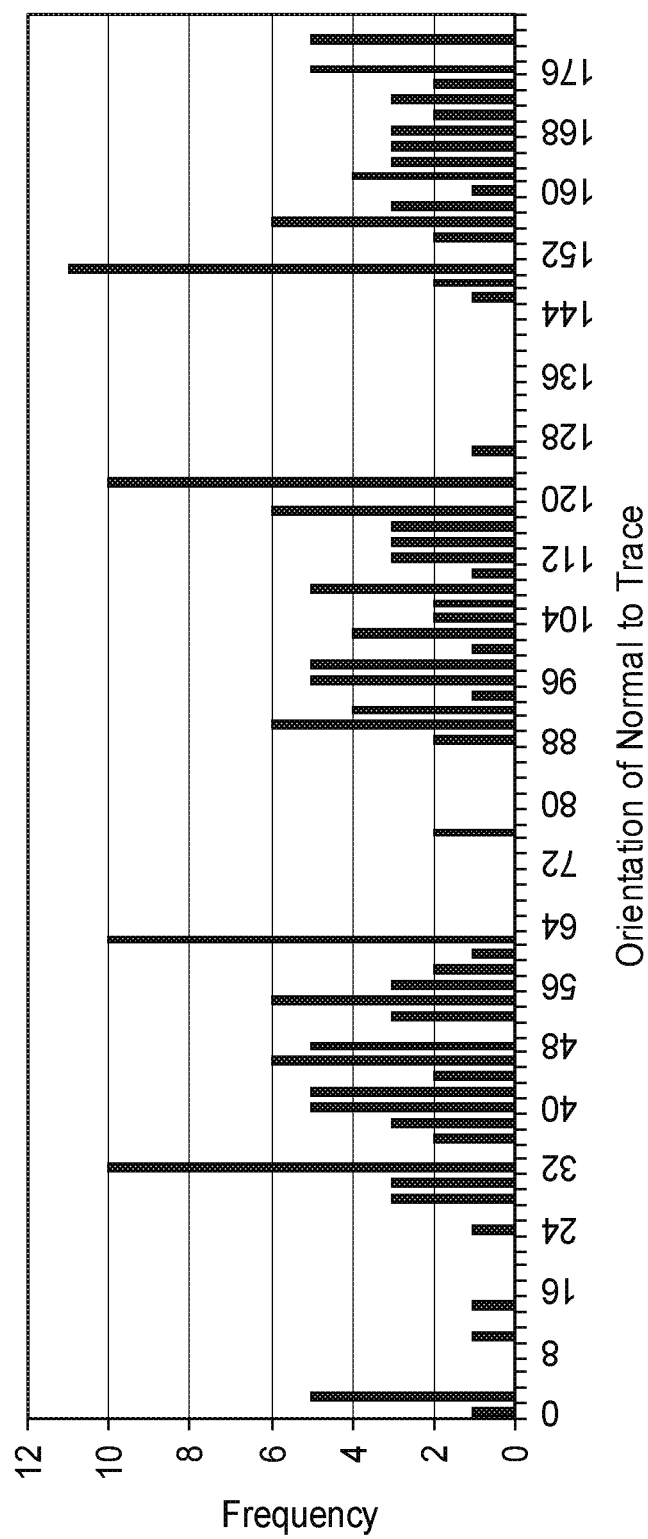
FIG. 9 shows a histogram of the orientation of normal to the trace segments for the partially curved hexagonal micropattern, a portion of which is shown in FIG. 3.
Figure 10:
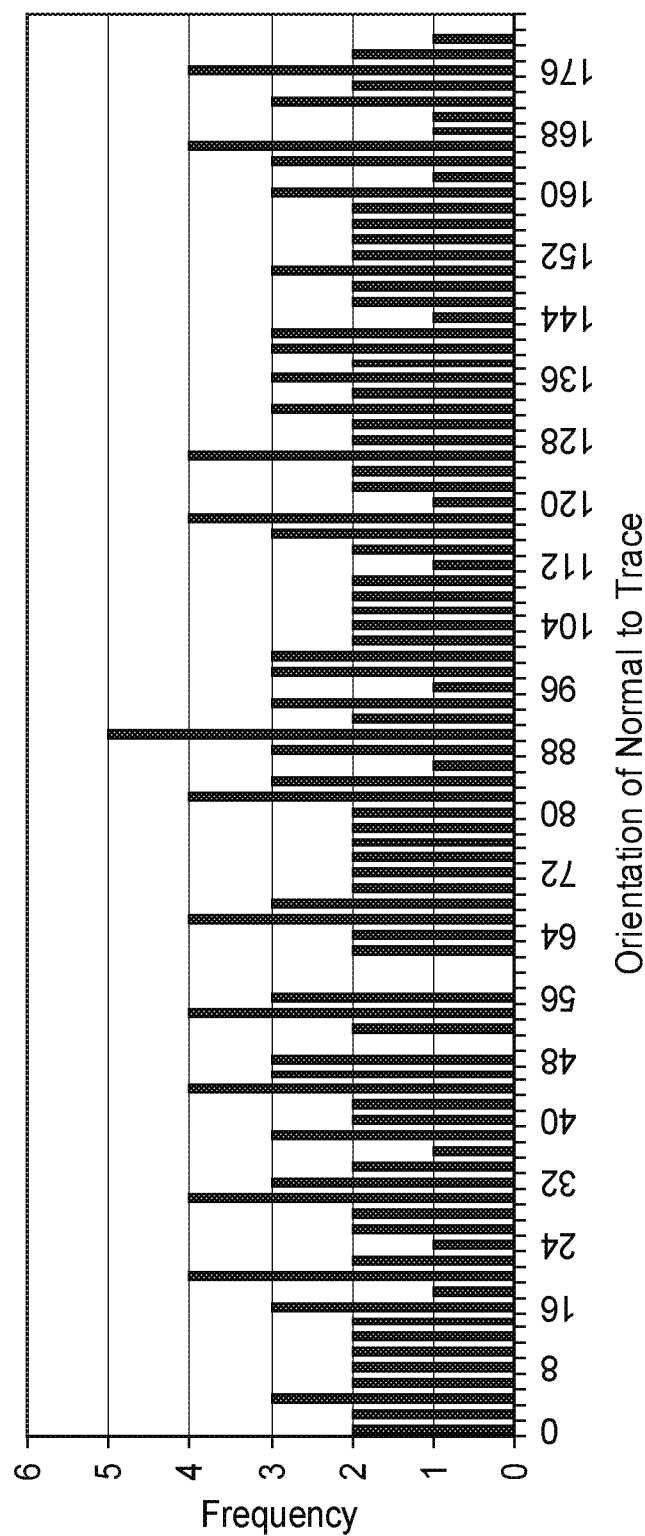
FIG. 10 shows a histogram of the angular distribution of the trace orientations for the fully curved hexagonal micropattern, a portion of which is shown in FIG. 4.

FIGS. 8, 9 and 10 show histograms of the angle θ for the pseudorandom hexagon micropattern of FIG. 2, the partially curved micropattern of FIG. 3, and the fully curved micropattern of FIG. 4 respectively. Each of these histograms has a broader distribution of angle θ as compared to the histogram for the micropattern of FIG. 1, with the histogram of FIG. 10 having the most uniform distribution of the four micropatterns. Furthermore, the standard deviation of these histograms is 1.6 (FIG. 8), 2.6 (FIG. 9) and 1.0 (FIG. 10).

Further describing the distribution of trace segment orientations within a conductor micropattern having non-linear traces, it is within the scope of a micropattern described herein to have a uniform distribution and yet have some orientations or small ranges of orientations not represented in the distribution. That is, a micropattern having an absolutely uniform distribution of trace or trace segment orientations across all 180° of possible orientations within a given area of the micropattern would not be removed from the scope of micropatterns described herein to have a "uniform distribution" by removal of a single trace (or trace segment) or by removal of all traces within a narrow range of angles, for example over a 5° range of angles, or for example over a 2° range of angles.

With reference to the procedure described above for measuring (approximately 200 measurements) and binning (2° bins) the frequencies of fractional trace segment orientations, the pseudorandom curved micropattern (FIG. 5) may have a standard deviation of measured frequency per 2° bin of less than 5, less than 3, less than 2, 1, or even less than 1.

In addition to the uniformity of the distribution of trace segment orientations, the geometry of the conductor micropatterns of the present disclosure can be described in terms of the radius of curvature of the traces. In some cases, the radii of curvature for traces comprising a micropattern are less than 1 centimeter. In some cases the radii of curvature for substantially all of the traces comprising the mesh pattern are less than 1 centimeter. In some cases the radii of curvature for traces comprising a micropattern are less than 1 millimeter. In some cases, the radii of curvature for substantially all of the traces comprising the micropattern are less than 1 millimeter. In some cases, the radii of curvature for traces comprising a mesh pattern are between 50 microns and 1 millimeter. In some cases, the radii of curvature for substantially all of the traces comprising the micropattern are between 50 microns and 1 millimeter. In some cases, the radii of curvature for traces comprising a micropattern are between 75 microns and 750 microns. In some cases, the radii of curvature for substantially all of the traces comprising the micropattern are between 75 microns and 750 microns. In some cases, the radii of curvature for traces comprising a mesh pattern are between 100 microns and 500 microns. In some cases, the radii of curvature for substantially all of the traces comprising the micropattern are between 100 microns and 500 microns. In some cases, the radii of curvature for traces comprising a micropattern are between 150 microns and 400 microns. In some cases the radii of curvature for substantially all of the traces comprising the micropattern are between 150 microns and 400 microns.

Conductor Comprising a Tri-Layer Material

The tri-layer (i.e., multilayer) material conductor is comprised of three vacuum-deposited thin films coated in the sequence "metal-dielectric-metal". The two metal layers differ in their optical properties. The first metal layer is optically opaque, thick enough to allow very low (e.g., essentially zero percent) light transmission, to be highly reflective and not be highly absorptive. The second layer is a dielectric layer, and is transparent at visible wavelengths. The third layer is a semi-transparent metal layer. The tri-layer can be deposited on the surface of a substrate in either of two orientations, or sequences (i.e., with the first metal deposited first or with the second metal deposited first). The thin film stack, if designed properly in terms of thickness and selection of metal and transparent materials, is observed from the side having the semi-transparent metal layer to exhibit reduced reflection. The interaction of light reflected from the top semi-transparent metal layer and the bottom opaque metal layer determines the spectral reflection, or observed color. In order to produce very low, or dark reflectance, the phase difference of these two reflections should be managed so that it is equal—and also the reflectance be as low as achievable—across the range of visible wavelengths. This is done by choosing appropriate materials and layer thicknesses for each layer. The opaque metal layer is generally silver or aluminum, but may be another highly reflective metal with low absorption. The dielectric layer is a polymer layer, comprised of acrylate materials, but may also be a visibly transparent inorganic material such as silicon dioxide, and the semi-transparent metal layer is generally chromium, but may also be another metal (such as titanium) which has an optical constant (n,k) ratio near unity. If it is desired for the two metal layers to be electrically connected, they must have a conduction path across the transparent layer. This may occur at defect locations in the transparent layer, the result of layer irregularities and faults which locally disturb layer homogeneity.

The tri-layer material can be prepared in coating chambers equipped with appropriate deposition sources in various ways; for example, sequential and continuous, such as roll to roll coating on film or in a conveyor line coating discrete substrates. Another approach employs a batch coating concept, one where a discrete substrate (or multiple of) is placed into the chamber and coated, then removed and replaced with the next batch. All three layers may be coated sequentially onto the batch in one chamber, or each batch may have one layer coated at a chamber, then moved to the next chamber for the next layer. In either approach, vacuum coating processes are best suited for coating the specified materials at the required very thin and very precise thickness levels. For the coating of metals and inorganic dielectrics, physical vapor deposition is most preferred, and electron beam deposition or sputtering are most widely used. If the dielectric (transparent) layer is organic, methods such as organic vapor deposition or plasma polymerization or liquid coating can be used.

Suitable metals for the opaque, highly reflective layer include silver, palladium, platinum, aluminum, copper, molybdenum, nickel, tin, tungsten, alloys, and combinations thereof. Suitable metals for the semi-reflective metal layer include titanium, chromium, aluminum, nickel, copper, gold, molybdenum, platinum, rhodium, silver, tungsten, cobalt, iron, germanium, hafnium, palladium, rhenium, vanadium, silicon, selenium, tantalum, yttrium, zirconium and combinations and alloys thereof. Suitable materials for the transparent material include acrylic polymers, $SiO_2$, $Al_2O_3$, $ZrO_2$, $TiO_2$, $HfO_2$, $Sc_2O_3$, $La_2O_3$, $ThO_2$, $Y_2O_3$, $CeO_2$, $MgO$, $Ta_2O_5$ and combinations thereof. In some embodiments, the semi-reflective metal comprises chromium or titanium, the opaque and reflective metal comprises silver or aluminum, and the transparent material comprises acrylic polymer, $SiO_2$, or $TiO_2$.

The thickness of the semi-reflective metal may be between 1 and 50 nanometers, in some cases between 2 and 20 nanometers. The thickness of the transparent materials may be between 20 and 100 nanometers, in some cases between 40 and 80 nanometers. The thickness of the opaque highly reflective metal may be between 50 nanometers and 10 micrometers, in some cases between 75 nanometers and 1 micrometer, and in yet other cases between 100 nanometers and 250 nanometers.

Method of Making the Conductor Micropatterns

Conductor micropatterns having the disclosed designs can be prepared using any suitable method. Examples of methods for preparing conductor micropatterns include subtractive or additive methods. Exemplary subtractive methods include placement of a patterned mask on a metallic coating disposed on a substrate (e.g., a visible light transparent substrate), followed by selective etching (with metal being removed from regions of the metallic coating that are not covered by the mask, and with metal remaining in regions of the metallic coating that are covered by the mask). Suitable masks include photoresist (patterned by photolithography, as is known in the art), printed polymers, or printed self-assembled monolayers (for example, printed using microcontact printing). Other exemplary subtractive methods include initial placement of a patterned lift-off mask on a substrate (e.g., a visible light transparent substrate), blanket coating of masked and unmasked regions with a metallic conductor (e.g., thin film metal), and washing of the lift-off mask and any metal disposed thereon. Exemplary additive processes include printing of electroless deposition catalyst on a substrate (e.g., visible light transparent substrate) in the form of the desired micropattern geometry, followed by patterned electroless metal deposition (e.g., copper or nickel).

Preferred methods for generating the conductor micropatterns include microcontact printing. As compared with other means for reducing the reflectance of conductor patterns (coating with a carbon black-filled material or partially reacting the metal to form an absorbing reaction product such as a sulfide), the means described herein were found to be particularly well-suited for combination with a patterning approach based on microcontact printing and etching, thus enabling specific micropattern design parameters (e.g., trace width from 0.5 to 10 micrometers, from 0.5 to 5 micrometers, or from 1 to 3 micrometers) and conductor thickness (e.g., the first metal layer or the second metal layer having thickness from 0.001 to 2 micrometer, from 0.05 to 1 micrometer, 0.075 to 0.5 micrometer, or from 0.1 to 0.25 micrometer) to be fabricated. The placement of carbon black-filled materials on micron scale features is impractical. The partial chemical conversion of sub-micron thick metals (e.g., 0.075 to 0.5 micrometer, or from 0.1 to 0.25 micrometer) to an absorptive reaction product is not effective for substantially reducing the reflectance without also substantially reducing the electrical conductance of the layer.

In the case of the substrate (e.g. visible light transparent) comprising nanostructured surface that is antireflective when exposed to air: a substrate is provided that includes a surface that is nanostructured and that is antireflective when exposed to air; a metallic conductor is deposited (e.g., by sputtering or by evaporation) onto the surface; a self-assembled monolayer (SAM) is printed in a pattern using an elastomeric stamp; and finally the metal is etched from deposited metal regions not having the SAM and not etched from deposited metal regions that include the SAM.

In the case of the tri-layer material conductor: a substrate (e.g., visible light transparent) is provided, with a major surface; a semi-reflective metal is deposited on the substrate surface (in some cases titanium with thickness between 1 and 20 nanometers); a transparent material is deposited on the semi-reflective metal (in some cases $SiO_2$ with thickness between 50 and 100 nanometers); an opaque reflective metal is deposited on the transparent material (in some cases Ti metallic conductor is deposited first as an adhesion promoting layer with a thickness of from 5 angstroms to 5 nanometers, followed by silver with a thickness of from 50 nanometers to 250 nanometers); a self-assembled monolayer (SAM) is printed in a pattern using an elastomeric stamp; and finally the silver is etched from deposited metal regions not having the SAM and not etched from deposited metal regions that include the SAM; in a second stage of etching, the subsequent layers of material under the opaque, reflective metal are etched from deposited metal regions not having the SAM and not etched from deposited metal regions that include the SAM.

Method of Making an Article Using Micropattern Conductors

A conductor micropattern disposed on a surface of a substrate is useful for making a number of different articles. Components that comprise transparent conductive patterns include touch sensor panels for touch displays. Some touch sensor panels for touch displays, for example some touch sensor panels that are suitable for combination with electronics that utilize mutual capacitance mode detection and that may include multi-touch resolution capability, include two or more conductor patterns that are overlaid. Two or more conductor patterns that are overlaid can be generated by laminating two substrates together with a clear adhesive, each substrate having disposed on one its major surfaces a conductor micropattern according to the present disclosure. Such laminated articles can be visible light transparent when the substrates are transparent and when the conductor micropattern have high open area fraction. Examples of suitable substrates for forming laminated constructions include the polymeric film substrates listed above.

Examples of suitable adhesive materials for forming laminated constructions are optically clear adhesive that exhibit an optical transmission of at least about 90%, or even higher, and a haze value of below about 5% or even lower. Optical transmission and haze can be measured by disposing it between a 25 micrometer Melinex® polyester film 454 (from DuPont Company, Wilmington, Del.) and a A 75×50 millimeter plain micro slide (a glass slide from Dow Corning, Midland, Mich.) using a Model 9970 BYK Gardner TCS Plus Spectrophotometer (from BYK Gardner, Columbia, Md.). Suitable optically clear adhesive may have antistatic properties, is compatible with metal-based conductors, may be able to be released from the glass substrate by stretching the adhesive described in Illustrative optically adhesive include those described in PCT International Publication No. WO 2008/128073 relating to antistatic optically pressure sensitive adhesive, U.S. Patent Application Publication Nos. US 2009-030084 A1 relating to stretch releasing optically clear pressure sensitive adhesive, US 2010-0028564 A1 relating to antistatic optical constructions having optically transmissive adhesive, PCT International Publication Nos. WO 2009/114683 relating to optically clear stretch release adhesive tape, WO 2010/019528 relating to adhesives compatible with corrosion sensitive layers, and WO 2010/078346 stretch release adhesive tape. In one embodiment, the optically clear adhesive has a thickness of about 5 μm or less.

A substrate having the conductor micropattern disposed thereon, or alternatively a laminate comprising two or more substrates having the conductor micropatterns disposed thereon, can be further laminated to a display, for example a liquid crystal display (LCD), an organic light-emitting diode (OLED) display, a plasma display panel (PDP), an electophoretic display (EP), or an electrowetting display. Such a substrate or laminate can be laminated to the display using the referenced adhesive materials. A substrate having the conductor micropattern disposed thereon, or alternatively a laminate comprising two or more substrates having the conductor micropatterns disposed thereon, can be further laminated to another material, for example a rigid support such as a thick (e.g., 1 millimeter) polymer sheet or glass sheet. Examples of rigid supports include the lenses of mobile handheld devices such as mobile phones or smart phones.

In some embodiments, a conductor micropattern as described herein is disposed on more than one side of a substrate, for example on each major surface of a flat substrate that may be flexible or rigid, as already described. For applications that require two conductor micropatterns that are nominally parallel in orientation and spaced apart in the direction normal to the micropatterns, it may be advantageous for the two micropatterns to be disposed on each side of the same flat substrate, for example on each side of a polymer film.

Figure 11:
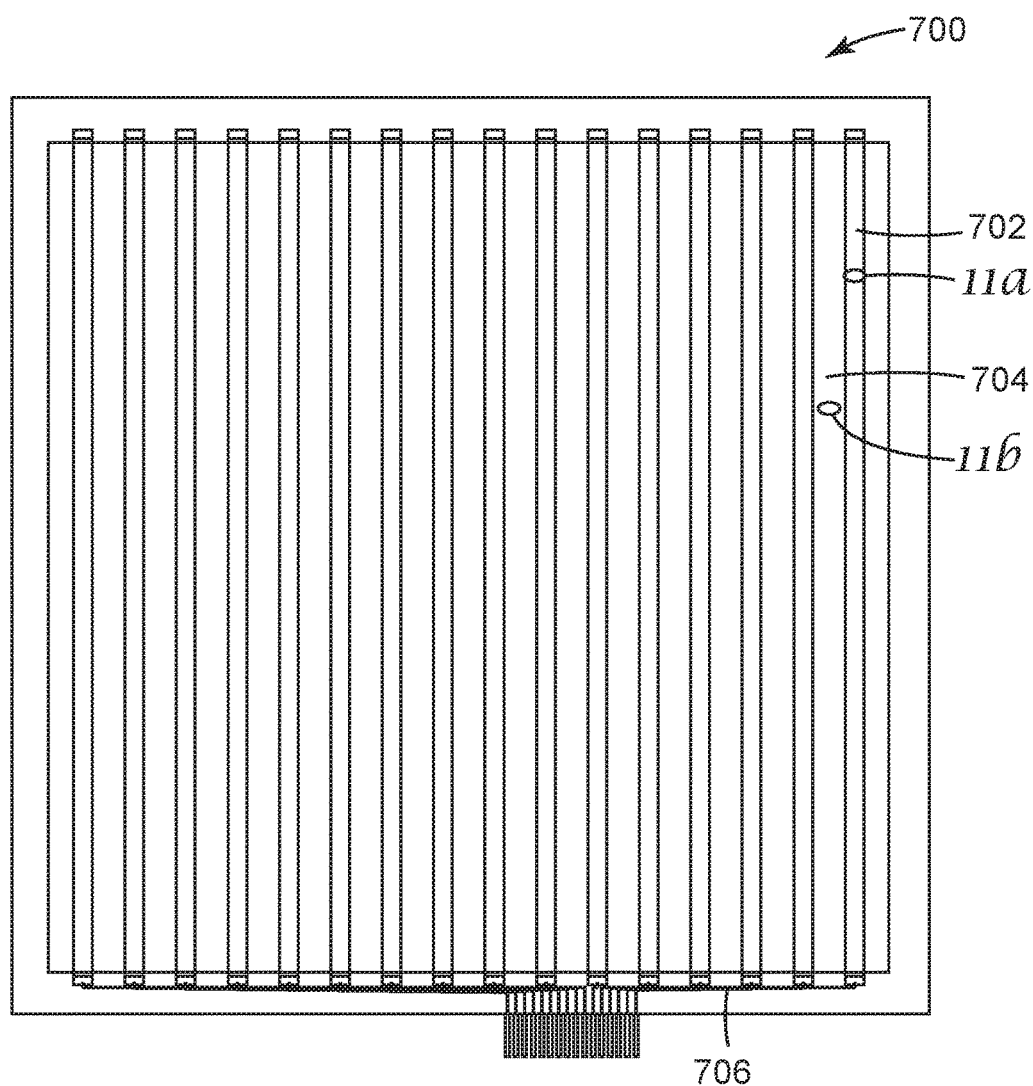
FIGS. 11, 11a and 11b show various portions of a first micropatterned substrate useful for integration into a device, such as a display.
Figure 11A:
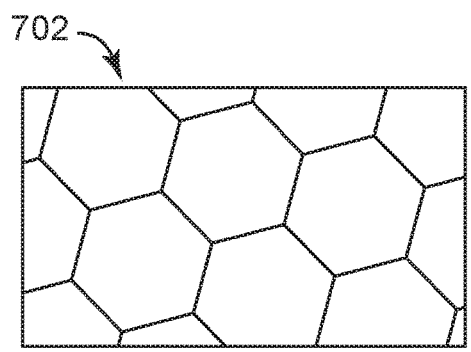
Figure 11B:
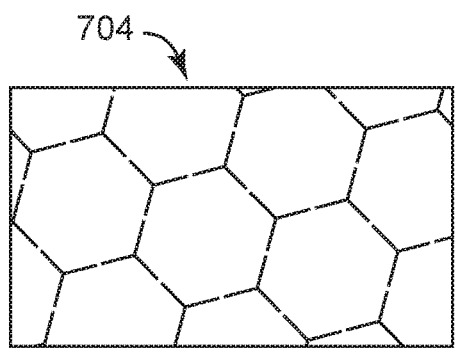

FIG. 11 shows an exemplary first patterned substrate 700 schematically (not to scale) having a plurality of first continuous regions 702 alternating between a plurality of first discontinuous regions 704 on a first side of the substrate, which is the side that contains the etched and patterned tri-layer (i.e., multilayer) conductor. The tri-layer conductor can be oriented with its semi-transparent metal layer proximate to the substrate, followed by its transparent dielectric layer, followed by its highly reflective optically opaque metal layer. The first patterned substrate actually has 11 first continuous regions 702. The first continuous regions 702 has width of approximately 2.2 millimeters, pitch of approximately 4.95 millimeters, and length of approximately 95 millimeters. The substrate has an opposing second side that was substantially bare PET film. Each of the first regions 702 has a corresponding 40 micron wide conductive trace 706 disposed at one end, for making electrical contact to each first continuous region 702. The mesh designs for the first patterned substrate can be pseudorandom in shape and size, including curvature for the conductive traces making up the meshes, as noted above (in contrast to the hexagonal mesh designs depicted in FIGS. 11a and 11b).

Formation of a Transparent Sensor Element Second Patterned Substrate

An exemplary second patterned substrate can be made as the first patterned substrate using a second visible light substrate to produce a second film with patterned tri-layer (i.e., multilayer) conductor. The tri-layer conductor can be oriented with its semi-transparent metal layer proximate to the substrate, followed by its transparent dielectric layer, followed by its highly reflective optically opaque metal layer. A second stamp can be produced having second continuous mesh pattern regions interposed between second discontinuous mesh pattern region.

FIG. 12 shows the second patterned substrate 720 schematically (not to scale) having a plurality of second continuous regions 722 alternating between a plurality of second discontinuous regions 724 on a first side of the second substrate, which is the side that contains the etched and patterned silver metallization. The second patterned substrate actually has 19 first continuous regions 722. The second continuous regions 722 has width of approximately 4.48 millimeters, pitch of approximately 4.93 millimeters, and length of approximately 55 millimeters. Each of the second continuous regions 722 has a corresponding 40 micron wide second conductive trace 726 disposed at one end, for making electrical contact to each second continuous region 722. The mesh designs for the first patterned substrate can be pseudorandom in shape and size, including curvature for the conductive traces making up the meshes, as noted above (in contrast to the hexagonal mesh designs depicted in FIGS. 12a and 12b).

Formation of a Projected Capacitive Touch Screen Sensor Element

The first and second patterned substrates made above can be used to produce a two-layer projected capacitive touch screen transparent sensor element as follows. The first and second patterned substrates were adhered together using Optically Clear Laminating Adhesive 8271 from 3M Company, St. Paul, Minn. to yield a multilayer construction. A handheld roller was used to laminate the two patterned substrates with the regions of the first and second conductive trace regions 706 and 726 being adhesive free. The multilayer construction was laminated to a 0.7 mm thick float glass using Optically Clear Laminating Adhesive 8146-3 such that the first side of the first substrate was proximate to the float glass. The adhesive free first and second conductive trace regions 706 and 726 allowed electrical connection to be made to the first and second patterned substrates 700 and 720.

Figure 13:
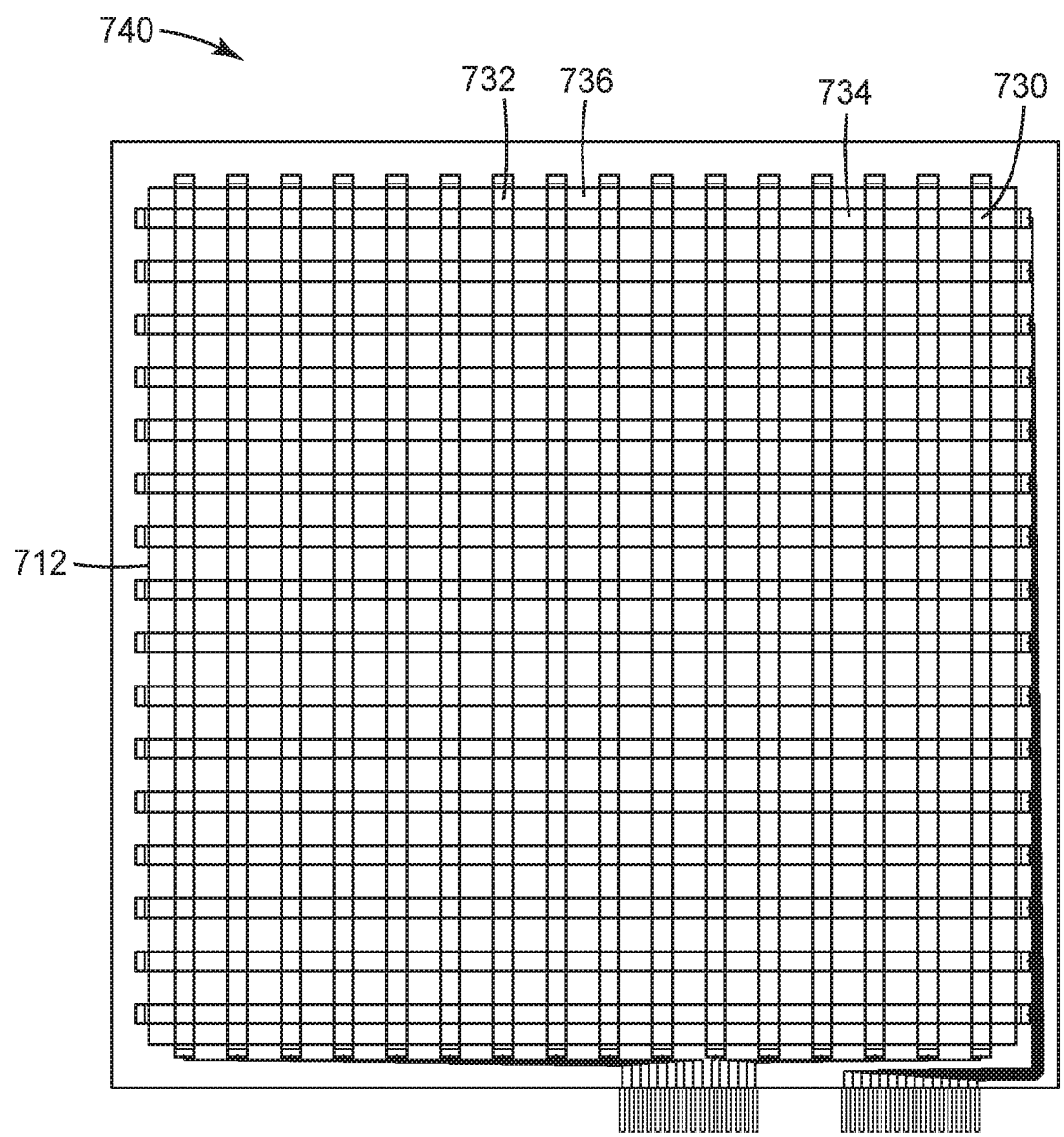
FIG. 13 shows the overlay of the first and second micropatterned substrate that can be integrated into a device.

FIG. 13 shows schematically (not to scale) a top plan view of a multilayer touch screen sensor element 740 where the first and second patterned substrate have been overlaid (as would result from laminating the first and second patterned substrates). Region 730 represents the overlap of the first and second continuous regions. Region 732 represents the overlap of the first continuous region and the second discontinuous region. Region 734 represents the overlap of the second continuous region and the first discontinuous region. And, region 736 represents the overlap between the first and second discontinuous regions. While there was a plurality of these overlap regions, for ease of illustration, only one region of each has been depicted in the figure.

Additional Components of the Touch Sensing System

The integrated circuits that can be used to make mutual capacitance measurements of the transparent sensor element are the CY3290-TMA300 TrueTouch™ Dev Kit with revision reference Rev *D, containing an I2C to USB converter bridge and microcontroller TMA350 (commercially available from Cypress Semiconductor, San Jose, Calif.). The TMA350 can be configured for the transparent sensor element, as is known in the art. The configuration can vary from touch screen to touch screen, depending on design. In this case, the system can drive 19 different bars and measure 11 different bars. The configuration of the TMA350 can include selection of the number of channels to convert, how accurately or quickly to take measurements, the noise and touch thresholds, any digital filtering to be applied and various other settings particular to the CY3290-TMA300. While the measurement from above was running, the microcontroller was also sending the data to a computer with monitor via the TrueTouch™ Bridge, which converts I2C from the TMA350 to USB for the computer interface. This USB interface allows the Cypress TrueTouch™ software to render data from the TMA350 and see how the values were changing between a touch and no touch.

Results of Testing of the Touch Sensing System

The transparent sensor element can be connected to the touch sensor drive device. When a finger touch is made to the glass surface, the computer monitor can render the position of touch that occurrs within the touch sensing region in the form of a color change (black to green) in the corresponding location of the monitor and displayed the location in an adjacent display to simulate the result of the touch screen system. When two, three, and four finger touches are made simultaneously to the glass surface, the computer monitor can render the positions of touches that occurr within the touch sensing region in the form of a color change (black to green) in the corresponding locations of the monitor and displayed the location in a touch screen simulation display.

Applications

In some embodiments, the articles described herein comprise a conductor micropattern comprising non-linear traces defining an open micropattern of a cell geometry disposed on or in a visible light transparent substrate. In some such embodiments, the conductor micropattern forms at least a portion of an EMI shield. In some such embodiments, the conductor micropattern forms at least a portion of an antenna. In some such embodiments, the conductor micropattern forms at least a portion of a touch sensor (for example a touch screen sensor). In some such embodiments, the conductor micropattern forms at least a portion of a display electrode, for example a counterelectrode, for example a counterelectrode in an electrophoretic display.

In some embodiments, the articles described herein comprise a first conductor micropattern comprising non-linear traces defining a first open micropattern of a cell geometry disposed on or in a visible light transparent substrate and a second conductor micropattern comprising non-linear traces defining a second open micropattern of a cell geometry electrically isolated from the first conductor micropattern. The second conductor micropattern may be disposed on the same substrate as the first conductor micropattern, or it may be disposed on another substrate. The second conductor micropattern overlays the first conductor micropattern.

In some embodiments, both conductor micropatterns form at least a portion of a touch sensor, for example a touch screen sensor.

In some embodiment, both conductor micropatterns form at least a portion of an electrophoretic display.

Alternatively, in another embodiment, one of the conductor micropatterns forms at least a portion of a touch sensor, for example a touch screen sensor, and the other conductor micropattern may function as an antenna for wireless communication.

In yet another embodiment, one of the conductor micropatterns forms at least a portion of a touch sensor, for example a touch screen sensor, and the other conductor micropattern may function as an electromagnetic interference (EMI) shield.

In yet another embodiment, one of the conductor micropatterns forms at least a portion of an antenna for wireless communication and the other conductive micropattern may function as an electromagnetic interference (EMI) shield.

EXAMPLES

Substrates

Two different substrates were used in this example section.

A first substrate was a visible light transparent substrate of polyethylene terephthalate ("PET") having a thickness of approximately 125 micrometers, commercially available as product number ST504 from E.I. du Pont de Nemours, Wilmington, Del. was used.

A second substrate was a structured triacetate film ("Structured TAC") prepared according to the disclosure of WO 2010/07871 A1. The starting substrate was a cellulose triacetate film having a thickness of 75 micrometers (commercially available from Island Pyrochemical Industries Corp., New York, N.Y.). This TAC film was thus modified to contain a nanostructure on a first surface of the substrate. The nanostructured surface exhibited a reflectance of 0.1-0.2%. The nanostructured surface exhibited a transmitted haze of 0.2-0.4%. The nanostructured surface comprised nanofeatures that were 100 to 250 nanometers in height. The height to width ratio (anisotropy) of the nanofeatures was greater than one.

Conductor

Onto the PET substrate or the Structured TAC substrate was deposited the following conductive coatings:

(1) a "sputtered silver" film, which is a multilayer construction of 5 angstrom thick of titanium disposed directly on the substrate followed by 100 nanometers thick of silver, both deposited using known vacuum sputtering methods, or (2) an "evaporated silver" film, which is a multilayer construction of 5 angstrom thick of titanium disposed directly on the substrate followed 100 nanometer thick of silver, both deposited using known electron-beam evaporation methods; or (3) an "evaporated multilayer" conductor, which is a multilayer construction of 15.5 nanometer thick first layer of titanium disposed directly on the substrate followed by 70 nanometer thick layer of silicon dioxide, followed by 2.2 nanometer thick second layer of titanium, followed by 90 nanometer of silver, all layers deposited using known electron beam evaporation method.

After deposition of the conductive coating, the substrate has a coated side containing the conductive coating and an opposite side, i.e., side with no conductive coating.

The conductive coating used for each geometry for examples herein was patterned by printing octadecylthiol self-assembled monolayer mask on its surface, followed by wet chemical etching, as described in U.S. Patent Application Publication No. US 2009/0218310. In the wet chemical etching step of the process for the evaporated multilayer conductor, all layers of the conductor (i.e., the first titanium layer, the silicon dioxide, the second titanium layer and the silver layer) were etched except in the area where the micropattern was to remain to form the traces.

Characterization of Substrate

The average percent reflection (% R) was used to measure both major surfaces (coated and bare sides) of the substrate (whether PET or Structured TAC) using a BYK Gardner color guide sphere.

One sample of each film was prepared by applying Yamato Black Vinyl Tape #200-38 (commercially available from Yamato International Corporation, Woodhaven, Mich.) to the opposite side of the measuring surface using a roller to minimize trapping air bubbles. To measure the surface total % reflection (specular and diffuse), the non-taped side of the sample was placed against an aperture of BYK Gardner Color-Guide Sphere. The % reflection was measured at 10° incident angle for the wavelength range of 400 to 700 nm. Note that when reflectivity is measured from the bare side (i.e., opposite the conductor-coated side), the measured reflectivity includes reflection from the interface between the substrate film and air. The % R for the substrates with the conductors are shown in Table 1 below

TABLE 1

Reflectance measurements

| Substrate Type | Conductive Coating Type | Reflectance (%), measured from coated side | Reflectance (%), measured from bare side |
|---|---|---|---|
| PET | Sputtered Ag | 93.71 | 88.68 |
| PET | Evaporated Ag | 92.65 | 88.89 |
| PET | Evaporated Multilayer | 93.56 | 20.64 |
| Structured TAC | Sputtered Ag | 79.44 | 7.52 |

Comparative Example C1

This example was made by using PET substrate and Sputtered Ag conductor using a regular hexagon conductor micropattern. The trace widths were approximately 2 micrometers. The diameter of the hexagonal cells (from face to parallel face) was approximately 200 micrometers. The open area fraction was approximately 98%.

Comparative Example C2

This example was made by using PET substrate and Sputtered Ag conductor using a regular hexagon conductor micropattern. The trace widths were approximately 2 micrometers. The open area fraction was approximately 98%.

Examples 3 Through 6

These examples were made by using the Structured TAC substrate and Sputtered Silver conductor with a regular hexagonal micropattern (Ex. 3), a pseudorandom hexagonal micropattern (Ex. 4), a partially curved hexagonal micropattern (Ex. 5) and a fully curved hexagonal micropattern (Ex. 6). In all cases, the trace widths were approximately 2 micrometers and the open area fractions were approximately 98%.

Example 7

This example can be made using the PET substrate and evaporated multilayer conductor. The pattern design is a regular hexagonal mesh with cell diameter of approximately 200 micrometers and trace width of approximately 2 micrometers. The open area fraction is approximately 98%. Following the patterning of the silver layer of the tri-layer material conductor, by microcontact printing followed by wet chemical etching (as referenced above), the subsequent layers of the Evaporated Multilayer conductor can be etched by wet chemical etching with a solution of 10:1 buffered oxide etch solution (385 mL; 10 parts 40% $NH_4F$ solution to 1 part 49% HF solution by volume). The multilayer film can be placed in the etch bath, on the surface of the solution with the patterned side facing down, in a plastic pan. The film should be removed from the etch bath after 62 seconds, rinsed immediately with a stream of DI water, and dried with an air gun.

Examples 8 Through 10

These examples were made by using the PET substrate and evaporated multilayer conductor with a pseudorandom hexagonal micropattern (Ex. 8), a partially curved hexagonal micropattern (Ex. 9) and a fully curved hexagonal micropattern (Ex. 10). In the cases of Examples 8-10, the trace widths were approximately 2 micrometers and the open area fractions were approximately 98%. Following the patterning of the silver layer of the tri-layer material conductor, by microcontact printing followed by wet chemical etching (as referenced above), the subsequent layers of the evaporated multilayer conductor were etched by wet chemical etching with a solution of 10:1 buffered oxide etch solution (385 mL; 10 parts 40% $NH_4F$ solution to 1 part 49% HF solution by volume). The multilayer film was placed in the etch bath, on the surface of the solution with the patterned side facing down, in a plastic pan. The film was removed from the etch bath after 62 seconds, rinsed immediately with a stream of DI water, and dried with an air gun.

Example 11

This example can be made using the Structured TAC substrate and Sputtered Silver conductor with a pseudorandom curved micropattern.

Example 12

This example can be made using the PET substrate and evaporated multilayer conductor with a pseudorandom curved micropattern.

TABLE 2

Summary of the examples

| Example Number | Substrate Type | Conductive Coating Type | Pattern Design Type |
|---|---|---|---|
| C1 | PET | Sputtered Ag | regular hexagon |
| C2 | PET | Sputtered Ag | pseudorandom hexagon |
| 3 | Structured TAC | Sputtered Ag | regular hexagon |
| 4 | Structured TAC | Sputtered Ag | pseudorandom hexagon |
| 5 | Structured TAC | Sputtered Ag | partially curved hexagon |
| 6 | Structured TAC | Sputtered Ag | fully curved hexagon |
| 7 | PET | Evaporated Multilayer | regular hexagon |
| 8 | PET | Evaporated Multilayer | pseudorandom hexagon |
| 9 | PET | Evaporated Multilayer | partially curved hexagon |
| 10 | PET | Evaporated Multilayer | fully curved hexagon |
| 11 | Structured TAC | Sputtered Ag | pseudorandom curved |
| 12 | PET | Evaporated Multilayer | pseudorandom curved |

Characterization of the Articles

Laminated articles having one or more conductor micropatterns were evaluated for the conspicuity of their micropatterns under sunlight illumination. The evaluation included visual inspection without magnification (unaided eye). The samples were further imaged using a digital camera (iPhone 3GS, Apple Computer Corp, Cupertino, Calif.). The sunlight illumination upon each sample was first attenuated by passage through a typical commercial architectural double-pane insulated glass unit window having a semi-reflective energy-management film applied, in order to reduce the intensity of light reaching the eye or the camera to a more suitable level for viewing or recording. A number of visual effects contributed to the conspicuity of the various micropatterns. A first such visual effect category is described herein as "starburst," which takes the form of a bright reflective pattern in the shape of a multi-pointed star when illuminated with bright (non-diffuse) sunlight. A regular hexagonal mesh can give rise to a six-pointed starburst. A regular square mesh can give rise to a four-pointed starburst. A second visual effect category is described herein as "rainbow," which takes the form of a band of reflection exhibiting a spectrum of colors along the band when illuminated with bright (non-diffuse) sunlight. A third visual effect category is described herein as "colored halo," which takes the form of diffuse pink and green halos that surround the point of direct specular reflection when illuminated with bright (non-diffuse) sunlight. A fourth visual effect category is described herein as "sparkle," which takes the form of bright points of light across the micropattern when illuminated with bright (non-diffuse) sunlight.

TABLE 3

Results of visual inspection for conductor micropattern examples

| Example Number | Starburst Score | Rainbow Score | Colored Halo Score | Sparkle Score |
|---|---|---|---|---|
| C1 | ⊗ | ⊗ | ⊕ | ⊕ |
| C2 | ⊗ | ⊕ | ⊕ | ⊗ |
| 3 | ⊕ | ⊕ | ⊕ | ⊕ |
| 4 | ⊕ | ⊕ | ⊕ | ⊕ |
| 5 | ⊕ | ⊕ | ⊕ | ⊕ |
| 6 | ⊕ | ⊕ | ⊕ | ⊕ |
| 7 | N/A | N/A | N/A | N/A |
| 8 | ⊕ | ⊕ | ⊕ | ⊕ |
| 9 | ⊕ | ⊕ | ⊕ | ⊕ |
| 10 | ⊕ | ⊕ | ⊕ | ⊕ |

The data in TABLE 3 in terms of score for starburst, rainbow, sparkle and colored halo are reported in terms of an acceptable visual appearance score, represented by ⊕ and an unacceptable visual appearance score ⊗. In determining the score, an acceptable score did not imply a total absence of the visual artifact (whether it is a starburst, rainbow, halo or sparkle) but, if present, the level of the artifact is at a level where it may be acceptable to a user (at least, more acceptable than for examples scored with ⊗). For Examples 3-6, as compared with C1 and C2, an improvement in appearance (less conspicuous features of the micropattern) was achieved for evaluation from either direction, relative to the micropattern (i.e., from the substrate film (nanostructure surface) side or from the side opposite the substrate film). The improvement (reduced conspicuity) was greater for evaluation (viewing) from the substrate film side.

Results of electrical and transmitted optical measurements for laminated conductor micropattern examples are reported in Table 4. Entries assigned to TAC and PET were derived from measurements made for each substrate type, laminated to glass as described above (baseline data). The light transmittance (% T), clarity (% C), and transmitted haze (% H) were measured using a Haze-Gard Plus (BYK-Gardner, Columbia, Md.).

TABLE 4

| Example Number | % T Film Side | % H Film Side | % C Film Side | % T Glass Side | % H Glass Side | % C Glass Side | Sheet Resist (ohm/sq) |
|---|---|---|---|---|---|---|---|
| C1 | 90.2 | 2.17 | 99.5 | 90.1 | 2.08 | 99.6 | 30 |
| C2 | 90.1 | 2.59 | 99.5 | 90.1 | 2.64 | 99.5 | 28 |
| 3 | 90.8 | 2.20 | 99.4 | 90.5 | 2.25 | 99.4 | 59 |
| 4 | 90.6 | 2.68 | 99.5 | 90.3 | 2.78 | 99.5 | 100 |
| 5 | 91.1 | 1.89 | 99.5 | 90.9 | 1.82 | 99.5 | 42 |
| 6 | 91.2 | 2.09 | 99.5 | 91.1 | 2.04 | 99.5 | 40 |
| 7 | N/A | N/A | N/A | N/A | N/A | N/A | N/A |
| 8 | 87.9 | 2.05 | 99.3 | 87.8 | 1.92 | 99.4 | 23 |
| 9 | 88.4 | 1.86 | 99.3 | 88.2 | 1.85 | 99.4 | 25 |
| 10 | 88.6 | 2.00 | 99.5 | 88.9 | 2.04 | 99.5 | 40 |
| TAC | 93.9 | 0.72 | 100 | 93.9 | 0.69 | 100 | N/A |
| PET | 91.8 | 0.60 | 100 | 91.8 | 0.60 | 100 | N/A |

Results of reflectance measurements for laminated conductor micropattern examples are reported in Table 5. Entries assigned to TAC and PET were derived from measurements made for each substrate type, laminated to glass as described above (baseline data). As shown in Table 5, the micropattern contributes less reflectance when disposed on the nanostructured substrate surface (that is antireflective when exposed to air), as compare with identical micropatterns disposed on standard substrate film (PET), when the former is when viewed and measured from the substrate side of the micropattern.

TABLE 5

| Example Number | % R Film Side | % Reflectance Contribution from Micropattern (Film Side) | % R Glass Side | % Reflectance Contribution from Micropattern (Glass Side) |
|---|---|---|---|---|
| C1 | 10.1 | 1.0 | 10.0 | 0.9 |
| C2 | 10.2 | 1.0 | 10.2 | 1.1 |
| 3 | 7.2 | 0.2 | 8.3 | 1.3 |
| 4 | 7.3 | 0.3 | 8.1 | 1.1 |
| 5 | 7.5 | 0.5 | 8.7 | 1.7 |
| 6 | 7.3 | 0.3 | 8.4 | 1.3 |
| 7 | N/A | N/A | N/A | N/A |
| 8 | 9.8 | 0.6 | 11.8 | 2.7 |
| 9 | 10.0 | 0.8 | 11.4 | 2.3 |
| 10 | 9.8 | 0.6 | 11.1 | 2.0 |
| TAC | 7.0 | N/A | 7.0 | N/A |
| PET | 9.2 | N/A | 9.1 | N/A |

What is claimed is:

1. An article comprising:
a substrate having opposing first and second surfaces; and
a conductor micropattern disposed on the first surface of the substrate, the conductor micropattern comprising a plurality of traces having a uniform distribution of trace orientation for the micropattern, the traces comprising a semi-reflective metal layer such that a light reflected from the semi-reflective metal layer and a light transmitted through the semi-reflective metal layer interfere destructively.

2. The article of claim 1, wherein the traces further comprise a reflective metal layer such that the light transmitted through the semi-reflective metal layer reflects from the reflective metal layer and then interferes with the light reflected from the semi-reflective metal layer.

3. The article of claim 2, wherein the traces further comprise a transparent layer disposed between the semi-reflective metal layer and the reflective metal layer.

4. The article of claim 2, wherein the semi-reflective metal layer has a thickness less than a thickness of the reflective metal layer.

5. The article of claim 4, wherein the thickness of the semi-reflective metal layer is less than 50 nm.

6. The article of claim 4, wherein the thickness of the semi-reflective metal layer is between 1 and 50 nm and the thickness of the reflective metal layer is between 75 nm and 1 micrometer.

7. The article of claim 2, wherein the semi-reflective metal layer is selected from the group consisting of titanium, chromium, aluminum, nickel, copper, gold, molybdenum, platinum, rhodium, silver, tungsten, cobalt, iron, germanium, hafnium, palladium, rhenium, vanadium, silicon, selenium, tantalum, yttrium, zirconium, and combinations and alloys thereof; and the reflective metal layer is selected from the group consisting of silver, palladium, platinum, aluminum, copper, molybdenum, nickel, tin, tungsten, and combinations and alloys thereof.

8. The article of claim 7, wherein the semi-reflective metal layer and the reflective metal layer comprise different metals.

9. The article of claim 1, wherein the traces have a specular reflectance of less than 50% at normal incidence and in a direction oriented toward the first surface of the substrate.

10. The article of claim 1, wherein the traces have a specular reflectance of less than 50% at normal incidence and in a direction oriented away the first surface of the substrate.

11. An article comprising:
a substrate having opposing first and second surfaces; and
a conductor micropattern disposed on the first surface of the substrate, the conductor micropattern comprising a plurality of traces having a uniform distribution of trace orientation for the conductor micropattern, the traces comprising first and second metal layers and a transparent layer disposed between the first and second metal layers, wherein the first metal layer is semi-reflective and semi-transparent, and the second metal layer is reflective and opaque.

12. The article of claim 11, wherein a light reflected from the first metal layer interferes destructively with a light that is transmitted through the first metal layer and reflected from the second metal layer.

13. The article of claim 11, wherein the traces have a specular reflectance of less than 50% at normal incidence and in a direction oriented toward the first surface of the substrate.

14. The article of claim 11, wherein the traces have a specular reflectance of less than 50% at normal incidence and in a direction oriented away the first surface of the substrate.

15. The article of claim 11, wherein the traces have a trace width from 0.5 to 10 micrometers and the uniform distribution of trace orientation for the micropattern has a standard deviation of measured frequency per two degree bin of less than four.

16. An article comprising:
a substrate having opposing first and second surfaces; and
a conductor micropattern disposed on the first surface of the substrate, the conductor micropattern comprising a plurality of traces having a uniform distribution of trace orientation for the micropattern, the traces comprising first and second metal layers and a transparent layer between the first and second metal layers, wherein the first metal layer comprises a first material and a first thickness such that the first metal layer is semi-reflective and semi-transparent, and the second metal layer comprises a second material and a second thickness such that the second metal layer is reflective and opaque.

17. The article of claim 16, wherein the first and second materials are the same.

18. The article of claim 16, wherein the first and second materials are different.

19. The article of claim 16, wherein the first thickness is less than the second thickness.

20. The article of claim 16, wherein a light reflected from the first metal layer interferes destructively with a light that is transmitted through the first metal layer and reflected from the second metal layer.

* * * * *

UNITED STATES PATENT AND TRADEMARK OFFICE
CERTIFICATE OF CORRECTION

| | |
|---|---|
| PATENT NO. | : 10,098,222 B2 |
| APPLICATION NO. | : 15/491430 |
| DATED | : October 9, 2018 |
| INVENTOR(S) | : Matthew Frey |

Page 1 of 1

It is certified that error appears in the above-identified patent and that said Letters Patent is hereby corrected as shown below:

Page 2, Column 1 (Related U.S. Application Data):
Line 2, Delete "PCT/US2012/023580" and insert -- PCT/US2012/023480 --, therefor.

Signed and Sealed this
Fourth Day of June, 2019

Andrei Iancu
*Director of the United States Patent and Trademark Office*